United States Patent

Takei et al.

[11] Patent Number: 5,284,730
[45] Date of Patent: Feb. 8, 1994

[54] ELECTROPHOTOGRAPHIC LIGHT-RECEIVING MEMBER

[75] Inventors: Tetsuya Takei, Nagahama; Shigeru Shirai, Hikone; Hirokazu Ohtoshi, Nagahama; Ryuji Okamura, Shiga; Yasuyoshi Takai, Nagahama; Hiroyuki Katagiri, Shiga, all of Japan

[73] Assignee: Canon Kabushiki Kaisha, Tokyo, Japan

[21] Appl. No.: 925,617

[22] Filed: Aug. 6, 1992

Related U.S. Application Data

[63] Continuation-in-part of Ser. No. 780,780, Oct. 23, 1991.

[30] Foreign Application Priority Data

| | | | |
|---|---|---|---|
| Oct. 24, 1990 | [JP] | Japan | 2-287564 |
| Oct. 24, 1990 | [JP] | Japan | 2-287565 |
| Mar. 29, 1991 | [JP] | Japan | 3-89316 |
| Aug. 30, 1991 | [JP] | Japan | 3-220385 |
| Aug. 30, 1991 | [JP] | Japan | 3-220386 |
| Sep. 20, 1991 | [JP] | Japan | 3-241751 |

[51] Int. Cl.$^5$ .................................. G03G 5/14
[52] U.S. Cl. .................................. 430/66
[58] Field of Search .............. 430/58, 59, 66, 67, 430/84, 95

[56] References Cited

U.S. PATENT DOCUMENTS

| | | | |
|---|---|---|---|
| 4,225,222 | 9/1980 | Kempter | 355/3 DR |
| 4,265,991 | 5/1981 | Hirai et al. | 430/64 |
| 4,483,911 | 11/1984 | Ogawa et al. | 430/65 |
| 4,539,283 | 9/1985 | Shirai et al. | 430/61 |
| 4,775,606 | 10/1988 | Shirai | 430/67 |
| 4,792,509 | 12/1988 | Shirai et al. | 430/64 |
| 4,824,749 | 4/1989 | Shirai et al. | 430/66 |

FOREIGN PATENT DOCUMENTS

| | | |
|---|---|---|
| 2746967 | 4/1979 | Fed. Rep. of Germany . |
| 2855718 | 6/1979 | Fed. Rep. of Germany . |
| 57-11556 | 1/1982 | Japan . |
| 60-67951 | 4/1984 | Japan . |
| 62-16861 | 7/1987 | Japan . |

Primary Examiner—John Goodrow
Attorney, Agent, or Firm—Fitzpatrick, Cella, Harper & Scinto

[57] ABSTRACT

An electrophotographic light-receiving member has a surface layer of a non-single crystal material $(Si_xC_yO_z)_tH_uF_v$ (wherein $0.1 \leq x \leq 0.4$, $0.4 \leq y \leq 0.7$, $0.05 \leq z \leq 0.2$, $x+y+z=1$, $0.299 \leq t \leq 0.589$, $0.41 \leq u \leq 0.7$, $0.001 \leq v \leq 0.1$ and $t+u+v=1$), in which the ratio of silicon atoms bonded to carbon atoms in the surface layer is at least 50% of the total number of silicon atoms, and the ratio of silicon atoms bonded to oxygen atoms is 10 to 30 atomic % of the total number of silicon atoms.

7 Claims, 6 Drawing Sheets

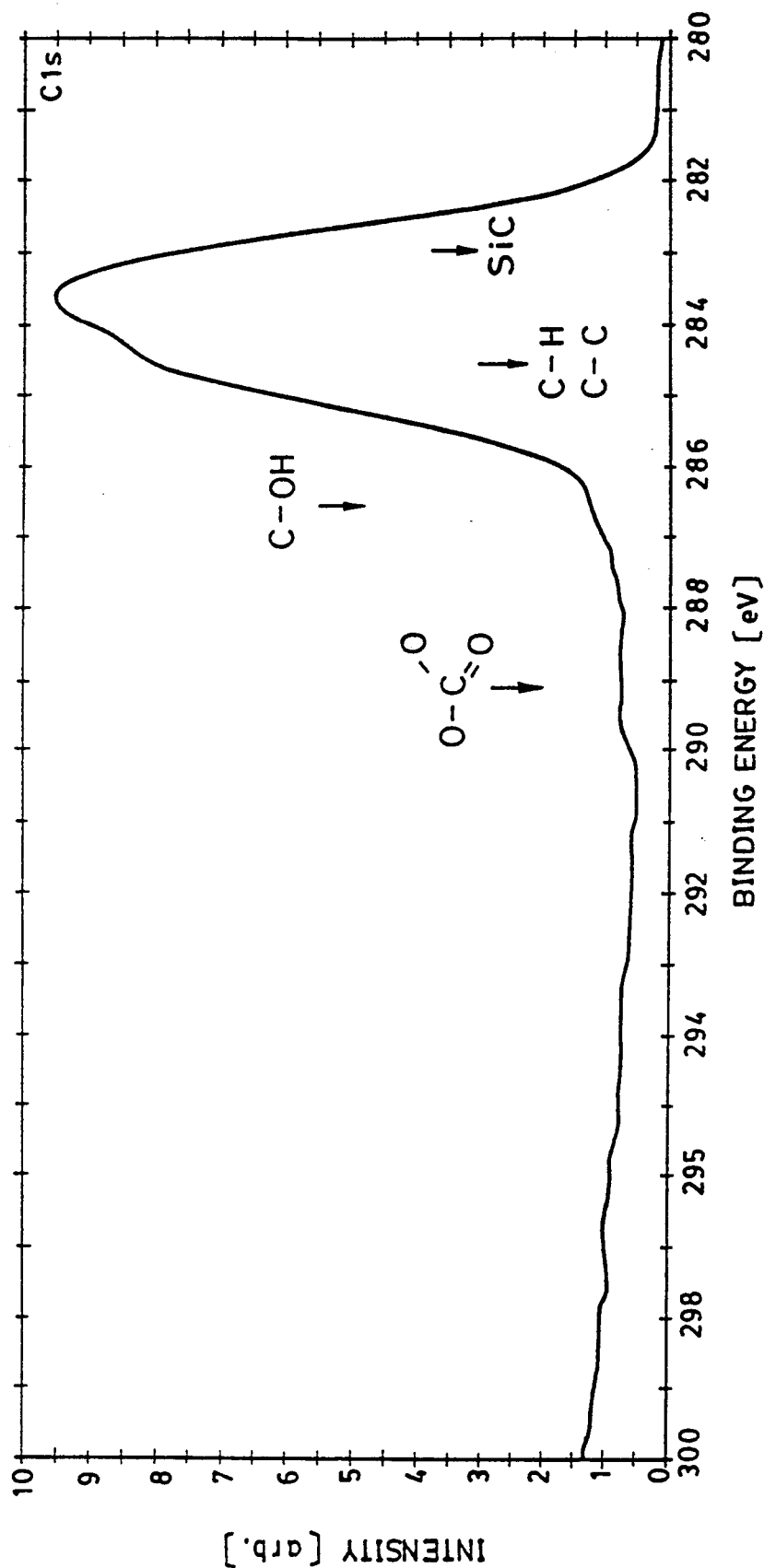

ELECTROPHOTOGRAPHIC LIGHT-RECEIVING MEMBER

This is a continuation-in-part of application Ser. No. 07/780,780, filed Oct. 23, 1991.

BACKGROUND OF THE INVENTION

Field of the Invention

The present invention relates to an electrophotographic light-receiving member having sensitivity to electromagnetic waves such as light (including ultraviolet rays, visible rays, infrared rays, X-rays, $\gamma$-rays and the like).

Description of the Related Art

In the field of image formation, photoconductive materials used for forming a light-receiving layer in an electrophotographic light-receiving member are required to have properties such as high sensitivity, high SN ratio, absorption spectral properties which conform with the spectral properties of the electromagnetic wave applied thereto, high photoresponsibility, desired dark resistance values, harmlessness to human bodies during use and the like.

A photoconductive material found to have such excellent properties is amorphous silicon (referred to as "A-Si or $\alpha$-Si" hereinafter). For example, Germany Patent Laid-Open Nos. 2746967 and 2855718 and Japanese Patent Laid-Open No. 54-86341 disclose the application of A-Si to an electrophotographic light-receiving member.

Japanese Patent Laid-Open No. 57-11556 discloses a technique in which a surface barrier layer made of a non-photoconductive amorphous material containing silicon and carbon atoms is provided on a photoconductive layer made of a silicon-based amorphous material for the purpose of attempting to improve the electrical, optical and photoconductive properties, such as the dark resistance value, photosensitivity, photoresponsibility and the like, of a photoconductive member having a photoconductive layer comprising an A-Si deposited film, the working environmental properties thereof such as humidity resistance and the like, and the time stability.

In addition, Patent Application No. 62-168161 discloses a technique which uses as a material for a surface layer a material consisting of an amorphous substance containing as components silicon atoms, carbon atoms and 41 to 70 atomic % of hydrogen atoms.

Further, Patent Application No. 60-67951 discloses a technique for a photosensitive material in which a light-transmitting insulating overcoat layer containing amorphous silicon, carbon, oxygen and fluorine is laminated on the photosensitive material.

The above techniques permit improvement in the electrical, optical and photoconductive properties of an electrophotographic light-receiving member, the working environmental properties and durability thereof, and the quality of the image formed.

On the other hand, as the copying speed, the printing speed (image forming speed) and durability of an electrophotographic apparatus are rapidly increased, the frequency of maintenance must be decreased for decreasing the service cost by improving the reliability of each of the parts of the apparatus. In these circumstances, an electrophotographic light-receiving member can be continuously repeatedly used under various environmental conditions for a longer time, without being subjected to maintenance by a service man.

In this situation, the fact is that conventional electrophotographic light-receiving members have room for improvement.

Particularly, the repeated use of the members at a high speed for a long time under high humidity sometimes causes the phenomenon that the fine lines on the image formed are blurred (image flowing), and in the extreme case, the characters of the image cannot be read. In addition, once an electrophotographic light-receiving member in an electrophotographic apparatus has produced the above phenomenon, it will continue to produce image flowing even if it is returned to environmental conditions under relatively low humidity which previously produced no image flowing. In a conventional method of preventing such image flowing caused under high humidity, a drum is heated for decreasing the relative humidity on the surface of the drum. However, this method requires heating of the surface of the drum to an extremely high temperature. Thus, the cost of the apparatus and the electricity consumption are increased, and the toner used sometimes adheres to the surface of the drum depending upon the set temperature.

In addition, when a light-receiving member having a hard surface with high durability is repeatedly used for a long time, as described above, the toner used sometimes adheres to the drum (filming), producing nonuniformity in density and blurs on the image formed.

SUMMARY OF THE INVENTION

It is an object of the present invention to solve the above-described problems of a conventional electrophotographic light-receiving member having a light-receiving layer made of A-Si.

Namely, it is a main object of the present invention to provide an electrophotographic light-receiving member having a light-receiving layer made of a silicon-based non-single crystal material which has electrical, optical and photoconductive properties which are substantially constantly stable without depending upon the working environment, which has excellent optical fatigue resistance, excellent durability without any deterioration during repeated use, and excellent moisture resistance, which shows substantially no residual potential and which produces substantially no filming of toner after repeated use.

According to a first aspect of the present invention, an electrophotographic light-receiving member comprises a substrate and a light-receiving layer formed on the substrate. The light-receiving layer has a surface layer or a surface-side region formed of a non-single crystal material comprising silicon, carbon and hydrogen atoms, where the ratio of silicon atoms each having at least one bond to a carbon atom in the surface layer or surface-side region is at least 50% of the total number of silicon atoms in the surface layer or surface-side region.

According to another aspect of the present invention, an electrophotographic light-receiving member comprises a non-single crystal layer comprising at least silicon, carbon, oxygen, hydrogen and fluorine atoms on an outermost surface layer, wherein the ratio of silicon atoms bonded to carbon atoms in the non-single crystal layer is 50 to 100 atomic % of the total number of silicon atoms therein, the ratio of silicon atoms bonded to oxygen atoms in the non-single crystal layer is 10 to 30 atomic % of the total number of silicon atoms therein, and the non-single crystal layer is substantially composed of a non-single crystal $(Si_xC_yO_z)_tH_uF_v$, wherein $0.1 \leq x \leq 0.4$, $0.4 \leq y \leq 0.7$, $0.05 \leq z \leq 0.2$, $x+y+z=1$, $03 \leq t \leq 0.59$, $0.41 \leq u \leq 0.7$, $0.001 \leq v \leq 0.1$ and $t+u+v=1$.

According to yet another aspect of the present invention, an electrophotographic light-receiving member comprises a non-single crystal layer comprising at least silicon, carbon, oxygen, hydrogen and fluorine atoms on an outermost surface, wherein the ratio of silicon atoms bonded to carbon atoms in the non-single crystal layer is 50 to 100 atomic % of the total number of silicon atoms, the ratio of silicon atoms bonded to oxygen atoms is 10 to 30 atomic % of the total number of silicon atoms, the ratio of carbon atoms bonded to oxygen atoms is 10 to 30 atomic % of the total number of carbon atoms, and the non-single crystal layer is substantially composed of a non-single crystal having the formula $(Si_xC_yO_z)_tH_uF_v$, wherein $0.1 \leq x \leq 0.4$, $0.4 \leq y \leq 0.7$, $0.05 \leq z \leq 0.2$, $x+y+z=1$, $0.3 \leq t \leq 0.59$, $0.41 \leq u \leq 0.7$, $0.001 \leq v \leq 0.1$ and $t+u+v=1$.

BRIEF DESCRIPTION OF THE DRAWINGS

FIGS. 8 and 9 are drawings of an example of spectra obtained by ESCA (Electron Spectroscopy for Chemical Analysis) of the surface of an electrophotographic light-receiving member according to the present invention.

DESCRIPTION OF THE PREFERRED EMBODIMENT OF THE INVENTION

Figure 1:
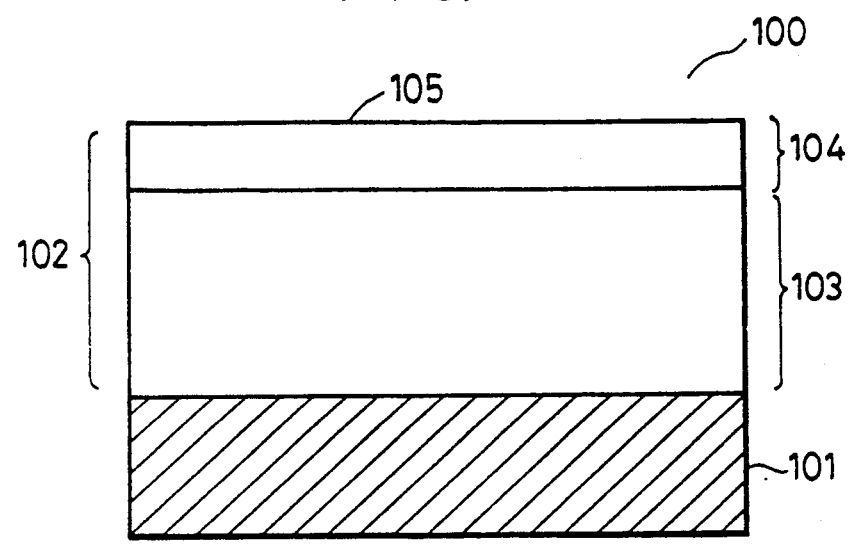
FIG. 1 shows a schematic drawing of a layer structure for explaining the layer structure of an electrophotographic light-receiving member according to the present invention.

In an electrophotographic light-receiving member according to the present invention which enables the above-described problems to be solved and the objects to be achieved, a ratio of bonds between silicon and carbon atoms in the region on the external surface side or the surface layer of the electrophotographic light-receiving member is set to a value within a desired region.

Particularly, the ratio of silicon atoms each having at least one bond to a carbon atom to the total number of silicon atoms in the surface layer or the surface region is set to be at least 50 atomic %.

It is also desirable to more sufficiently solve the above-described filming problem to respectively set the ratio of bonds between silicon and carbon atoms and the ratio of bonds between silicon and oxygen atoms to values within desired ranges.

Particularly, the ratio of silicon atoms each having at least one bond to a carbon atom to the total number of silicon atoms in the surface layer or the surface region is set to be at least 50 atomic %, and the ratio of silicon atoms each having at least one bond to an oxygen atom to the total number of silicon atoms therein is within the range of 10 to 30 atomic %.

The electrophotographic light-receiving member of the present invention comprises a substrate and a light-receiving layer having a photoconductive layer region which is made of a silicon-based non-single crystal material containing as a component at least one of hydrogen and halogen atoms and which exhibits photoconductivity, and a surface layer region which is made of a non-single crystal material containing as components silicon, carbon, oxygen, hydrogen and fluorine atoms, both regions being formed on the substrate, wherein the ratio of silicon atoms each having at least one bond to a carbon atom in the surface layer region is at least 50% of the total number of silicon atoms in the surface layer region.

In another feature of the invention, the electrophotographic light-receiving member has an outermost surface comprising a non-single crystal layer which contains at least silicon, carbon, oxygen, fluorine and hydrogen atoms, wherein the ratio of silicon atoms bonded to carbon atoms in the non-single crystal layer is 50 to 100 atomic % of the total number of silicon atoms, the ratio of silicon atoms bonded to oxygen atoms is 10 to 30 atomic % of the total number of silicon atoms, and the non-single crystal layer is made of a non-single crystal $(Si_xC_yO_z)_tH_uF_v$ (wherein $0.1 \leq x \leq 0.4$, $0.4 \leq y \leq 0.7$, $0.05 \leq z \leq 0.2$, $x+y+z=1$, $0.3 \leq t \leq 0.59$, $0.41 \leq u \leq 0.7$, $0.001 \leq v \leq 0.1$ and $t+u+v=1$).

In a further feature of the invention, the electrophotographic light-receiving member has an outermost surface comprising a non-single crystal layer which contains at least silicon, carbon, oxygen, fluorine and hydrogen atoms, wherein the ratio of silicon atoms bonded to carbon atoms in the non-single crystal layer is 50 to 100 atomic % of the total number of silicon atoms, the ratio of silicon atoms bonded to oxygen atoms is 10 to 30 atomic % of the total number of silicon atoms, the ratio of carbon atoms bonded to oxygen atoms is 10 to 30 atomic % of the total number of carbon atoms, and the non-single crystal layer is made of a non-single crystal expressed by the formula $(Si_xC_yO_z)_tH_uF_v$ (wherein $0.1 \leq x \leq 0.4$, $0.4 \leq y \leq 0.7$, $0.05 \leq z \leq 0.2$, $x+y+z=1$, $0.3 \leq t \leq 0.59$, $0.41 \leq u \leq 0.7$, $0.001 \leq v \leq 0.1$ and $t+u+v=1$).

The electrophotographic light-receiving member of the present invention designed so as to have the above layer structure is capable of solving all the above-mentioned problems and shows extremely excellent electrical, optical and photoconductive properties, durability and working environmental properties.

The present invention can provide an electrophotographic light-receiving member showing an excellent effect for preventing the occurrence of filming.

The electrophotographic light-receiving member of the present invention is described below.

As a result of energetic investigation conducted by the inventors having attention to the point that the above problems can be solved by improving the surface layer, the inventors found that the object is achieved by specifying a method of bonding silicon atoms in the surface layer.

The inventors believe that an electrophotographic apparatus which employs a conventional electrophotographic light-receiving member produces image flowing under a high-humidity environment due to the two following phenomena which are considered as important mechanisms for image flowing:

(1) The phenomenon that hygroscopic substances such as oxides like $NO_x$ are generated during corona discharge by a charger, causing paper powder produced from transfer paper and the like to adhere to the surface of the light-receiving member and absorb water at high humidity. The resistance is therefore decreased, and image flowing thus occurs.

(2) The phenomenon that the reaction to the material of the surface of the light-receiving member with oxygen contained in water and air due to corona energy causes a decrease in resistance, or an oxide which is decreased in resistance by absorption of water is produced, thereby causing image flowing.

Most of the substances adhered due to the phenomenon (1) can be removed by rubbing the light-receiving member with a toner, an abrasive contained in the toner, a blade or the like during the electrophotographic process. If the adhered substances cannot be sufficiently removed, the light-receiving member is separated from the electrophotographic apparatus by a service man so that the substance can be completely or substantially completely (to an extent which has no or substantially no effect on the formation of an image) cleaned by wiping the surface of the member with water, an organic solvent or the like.

It is also effective as a measure against the image flowing caused by the phenomenon (1) to decrease the relative humidity of the surface by heating the light-receiving member.

However, the image flowing cased by the mechanism described in the phenomenon (2) can hardly be removed by rubbing the light-receiving member with a toner, an abrasive contained in the toner, a blade or the like, or wiping the surface the light-receiving member with water, an organic solvent or the like by a service man.

The method of decreasing the relative humidity of the surface of the light-receiving member by heating it is only slightly effective as a measure against the image flowing caused by phenomenon (2). If the light-receiving member is heated to a high temperature, the method has an effect.

In addition, the phenomenon (2) frequently causes problems other than the image flowing, e.g., a decrease in sensitivity, an increase in residual potential and the like.

Previously, although the above two phenomena are not clearly separately considered, since, in fact, the image flowing is mostly caused by the phenomenon (1), no critical problem occurs in the market.

However, since the development of an electrophotographic apparatus provided with no means for heating a light-receiving member for the purposes of cost-cutting, energy saving and the like, and since copying is continuously repeated at a higher speed for a longer time than conventional apparatuses, attention is paid to image flowing which is insufficiently removed by the conventional measures and which is caused by the phenomenon (2).

As described above, a surface layer or surface region (generically named "surface layer" hereinafter) of a light-receiving member is generally made of a non-single crystal material containing as components silicon, carbon and hydrogen atoms for the purpose of improving the electrical, optical and photoconductive properties, working environmental properties, durability and the quality of the image formed.

The amount of carbon atoms contained in such a surface layer is $1 \times 10^{-3}$ to 90 atomic %, preferably 10 to 80 atomic %, relative to 100% of the total of silicon and carbon atoms. When the surface layer is formed irrespective of the state of bonding between silicon atoms and carbon atoms, the silicon and carbon atoms are not uniformly distributed, thereby producing a state wherein portion with a high content of silicon atoms and portions with a high content of carbon atoms are mixed.

The number of silicon atoms each having at least one bond to a carbon atom is thus smaller than the value estimated from the above composition.

On the other hand, the inventors found that phenomenon (2) is generated under corona discharge by bonding of oxygen with the dangling bonds of the silicon atoms which are present in the surface layer initially or which are produced by breakage of Si-H and Si-Si bonds, caused by corona energy. As a result of ESCA analysis of the surface of a light-receiving member which is produced irrespective of the bonding between silicon and carbon atoms and which produces the phenomenon (2), it was confirmed that about 10 to 30% of silicon atoms are joined to oxygen atoms. If the state of bonding between the silicon and oxygen atoms is expressed by $SiO_2$, z is 1.0 to 1.5.

However, results of many experiments showed that if a silicon atom has at least one bond to a carbon atom, the above-described oxidation is not easily produced. In this case, even if the oxidation is produced, the effect on the electrophotographic properties is decreased. When a light-receiving member is produced in sufficient consideration of the ratio of bonding between silicon and carbon atoms, image flowing and the like are effectively removed.

It is only slightly effective to simply increase the flow rate of gas containing carbon atoms in the raw materials gases for the purpose of increasing the probability of bonding between silicon and carbon atoms. As described above, this is because silicon and carbon atoms are not uniformly distributed in a deposited film. It is therefore difficult to increase the ratio of silicon atoms each having at least one bond to a carbon atom to 30% or more of the total silicon atoms contained in the surface layer by simply increasing the flow rate of the gas containing carbon atoms. In addition, when the amount of carbon atoms is increased, other properties such as the mechanical strength required for an electrophotographic light-receiving member, the sufficiently wide optical band gap and the like are sometime deteriorated, with insufficient removal of the image flowing.

In the present invention, the surface layer is formed by using a material in which the ratio of silicon atoms each having at least one bond to a carbon atom to the total number of silicon atoms is set to a value which is higher than conventional values, so that the above properties which are opposite to each other can be satisfactorily improved.

Further, in the present invention, the surface layer is formed by using a material in which the ratio of silicon atoms each having at least one bond to a carbon atom and the ratio of silicon atoms each having at least one bond to an oxygen atom relative to the total number of silicon atoms, are respectively specified to values which are higher than conventional values so that the weathering resistance and environmental properties can be improved without the mechanical strength and transparency (transmitting an electromagnetic wave having a desired wavelength) deteriorating, and an electrophotographic light-receiving member having a great effect of preventing toner filming can be achieved. Further enhanced properties are obtained if the ratio of carbon atoms having at least one bond to an oxygen atom to the total number of carbon atoms is much higher than conventional values.

Although the detailed function of the effect of preventing toner filming is not clear, it is believed that when the bonding among the silicon, carbon and oxygen atoms is optimum, the formation of weak bonding between the resin in the toner and the surface of the light-receiving member, which causes the occurrence of filming, can be minimized.

It is believed that the silicon, carbon and oxygen atoms are nonuniformly distributed in a deposited film. Areas of higher concentration of silicon, carbon or oxygen atoms are therefore present in the surface layer. Accordingly, the numbers of bonds between the respective atoms is, in fact, smaller than the values estimated from the proportions of such atoms in the composition of the layer. Therefore, by employing a material in which the ratio of the silicon atoms each having at least one bond to a carbon atom or an oxygen atom and, preferably wherein the ratio of carbon atoms bonded to oxygen atoms, is substantially higher than conventional values, that problem is alleviated.

In addition, the presence of fluorine atoms provides further beneficial effects. The fluorine atoms function, at least in part, to prevent the bonds between the silicon and carbon atoms from being severed by corona discharge or the like.

A photoconductive member of the present invention is described in detail below with reference to the drawings.

FIG. 1 is a schematic drawing of the layer structure of an electrophotographic light-receiving member in accordance with a preferred embodiment of the present invention.

The electrophotographic light-receiving member 100 shown in FIG. 1 has a substrate 101 used for a light-receiving member and a light-receiving layer 102 provided on the substrate 101. The light-receiving layer 102 has a photoconductive layer 103 which is made of A-Si(H,X) (a silicon-based non-single crystal material containing hydrogen and/or halogen atoms) and which has photoconductivity, and surface layer 104 which is made of non-single crystal material containing silicon and carbon atoms. In the surface layer 104, at least a surface-side region thereof contains a ratio of at least 50% silicon atoms each having at least one bond to a carbon atom relative to the total number of silicon atoms in the surface layer and the ratio of silicon atoms each having at least one bond to an oxygen atom relative to the total number of silicon atoms therein is from 10 to 30 atomic percent. In addition, it is preferred that the ratio of carbon atoms bonded to oxygen atoms relative to the total number of atoms is from 10 to 30 atomic percent.

The substrate used in the present invention may either be electroconductive or insulative. Examples of electroconductive substrates include metals such as NiCr, stainless steel, Al, Cr, Mo, Au, In, Nb, Ta, V, Ti, Pt, Pb, Fe and the like; alloys and laminates thereof and the like.

Examples of the insulating substrates that are generally used include films and sheets of synthetic resins such as polyester, polyethylene, polycarbonate, cellulose acetate, polypropylene, polyvinyl chloride, polyvinylidene chloride; polystyrene, polyamides and the like; glass; ceramics, paper. Any one of these insulating substrates preferably has at least one surface which is subjected to electroconductive treatment. It is desirable to provide the light-receiving layer on the thus-treated surface.

In the case of glass, for instance, a thin film is formed on the surface of the glass by using at least one material selected from the group consisting of NiCr, Al, Cr, Mo, Au, Ir, Nb, Ta, V, Ti, Pt, Pd, $In_2O_3$, $SnO_2$, ITO ($In_2O_3 + SnO_2$) and the like so that electroconductivity is provided to the surface. In the case of a synthetic resin film such as polyester film or the like, a thin film is formed on a surface of the film by vacuum deposition, electron beam deposition, sputtering or the like of at least one metal selected from the group NiCr, Al, Ag, Pb, Zn, Ni, Au, Cr, Mo, Ir, Nb, Ta, V, Ti, Pt and the like or laminating the surface with at least one of the metals so that electroconductivity is provided to the surface. The substrate can be formed into a desired shape such as a cylindrical, belt-like, plate-like shape or the like, which can be determined according to desire. For example, an endless belt-like or cylindrical shape is preferable for continuous high-speed copying. The thickness of the substrate is appropriately determined so that a desired electrophotographic light-receiving member can be formed. When the electrophotographic light-receiving member is required to have flexibility, the substrate is made as thin as possible within a range which allows the function as a substrate to be sufficiently exhibited. However, in this case, the substrate is generally 10 $\mu$ or more in view of the production and handling of the substrate or the mechanical strength thereof.

In addition, when an image is recorded by using coherent light such as laser beams, desired irregularities may be provided on a surface of the substrate for the purpose of removing defective images caused by a so-called interference fringe pattern, which is produced in a visible image.

FIGS. 2(A) to 2(C) are schematic sectional views of substrates which respectively show examples of irregularities.

When irregularities are provided on a surface of the substrate, a cutting tool having a V-shaped cutting edge is fixed to a predetermined position of a cutting machine such as a milling machine, a lathe or the like. For example, a cylindrical substrate is regularly moved in a predetermined direction while being rotated according to a program so that the surface of the substrate can be accurately cut to form irregularities with a desired shape, pitch and depth. The reverse V-form linear projecting portion of the irregularities formed by the above cutting method has a helical structure along the axis of the cylindrical substrate. The helical structure of the reverse V-form linear projecting portion may be a double or treble helical structure or a cross-helical structure.

Further, a delay line structure along the axis may be added to the helical structure.

Figure 2:
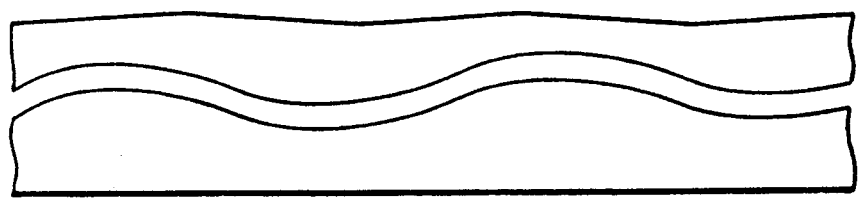
FIGS. 2(A), (B) and (C) are explanatory views respectively showing examples of the uneven shape of the surface of a substrate.
Figure 2:
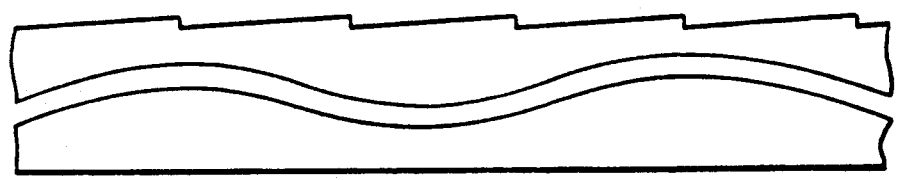
Figure 2:
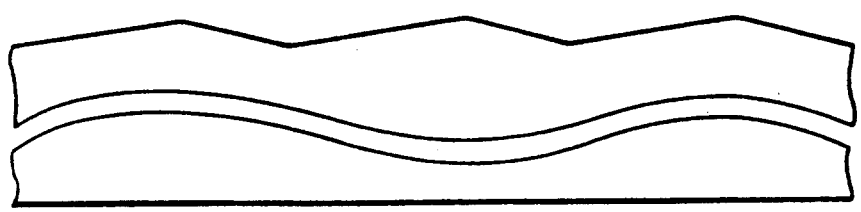
Figure 3:
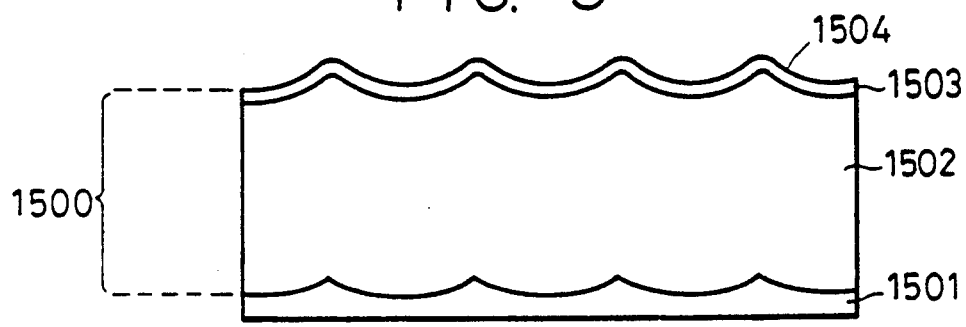
FIG. 3 is an explanatory view showing another example of the uneven shape of the surface of a substrate.

The cross-sectional form of the convex portion of the irregularities provided on the surface of the substrate preferably is a reverse V-form so as to ensure that there is controlled unevenness of the thickness in a minute column for each of the layers formed, and good adhesion and desired electrical contact properties between the substrate and the layer provided directly thereon. However, as shown in FIG. 2, the sectional form of the convex portion is preferably substantially an equilateral triangle, a right-angled triangle or an unequilateral triangle. Of these forms, an equilateral triangle and right-angled triangle are most preferable.

In the present invention, the dimensions of the irregularities provided in the surface of the substrate in a controlled state are determined in consideration of the points below so that the object of the present invention can be consequently achieved.

That is, firstly, the amorphous silicon (A-Si (H,X)) which contains hydrogen and/or halogen atoms and which forms the light-receiving layer is sensitive to the state of the surface on which the layer is formed, and the layer quality significantly depends upon the surface state.

It is therefore necessary to determine the dimensions of the irregularity provided on the surface of the substrate so that the quality of the A-Si (H,X) layer does not deteriorate.

Secondly, if the free surface 105 of the light-receiving layer has extreme irregularities, the image formed cannot be completely cleaned during the cleaning process after the formation thereof.

There is also the problem that in the case of cleaning with a blade, the blade is easily damaged.

As a result of investigation of the problems with respect to the formation of a layer, the problems with respect to the electrophotographic process and conditions for preventing the occurrence of an interference fringe pattern, the pitch of the concave portions on the surface of the substrate is preferably 500 to 0.3 µm, more preferably 200 to 1 µm, most preferably 50 to 5 µm.

The maximum depth of the concave portions is preferably 0.1 to 5 µm, more preferably 0.3 to 3 µm, most preferably 0.6 to 2 µm. When the pitch and the maximum depth of the concave portions are within the above ranges, the inclination of the slope of each concave portion (or linear projecting portion) is preferably 1 to 20°, more preferably 3 to 15°, most preferably 4 to 10°.

The maximum difference in thickness based on nonuniformity in the layer thickness of each of the layers deposited on the substrate is preferably 0.1 to 2 µm, more preferably 0.1 to 1.5 µm, most preferably 0.2 to 1 µm, within the same pitch.

In another method of removing defective images caused by an interference fringe pattern when coherent light such as laser beams or the like is used, irregularities are provided by forming a plurality of fine spherical dimples on the surface of the substrate.

Namely, the size of the irregularities which are composed of a plurality of the fine spherical dimples and which are formed on the surface of the substrate is smaller than the resolving power required for the electrophotographic light-receiving member.

Although the shape of the surface of the substrate and a preferable example of the methods of producing the substrate in the electrophotographic light-receiving member of the present invention are described with reference to FIG. 4, the shape and production method for the substrate in the light-receiving member of the invention are not limited to them.

Figure 4:
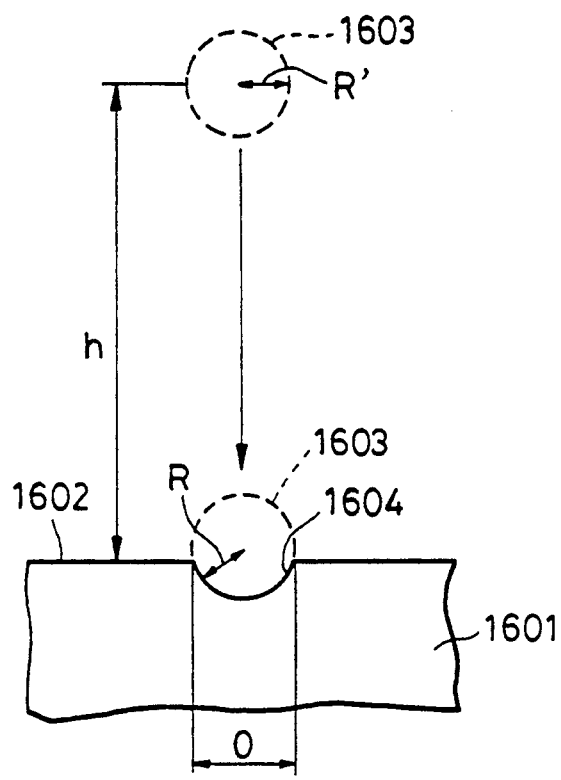
FIG. 4 is a schematic drawing showing a method of forming the example of the uneven shape shown in FIG. 3.

FIG. 4 is a schematic drawing of a typical example of the shape of the substrate surface in the electrophotographic light-receiving member according to the present invention in which an irregular portion is enlarged.

In FIG. 4, reference numeral 1601 denotes a substrate; reference number 1602, a surface of the substrate; reference numeral 1603, a rigid sphere; and reference numeral 1604, a spherical dimple.

FIG. 4 also shows a preferred example of methods of obtaining the surface shape of the substrate. Namely, FIG. 4 shows that the spherical recess 1604 can be formed by causing the rigid sphere 1603 to gravitationally fall from a position at a predetermined height from the substrate surface 1602 so that the sphere 1603 collides against the surface 1602 of the substrate. A plurality of spherical dimples 1604 having substantially the same radius of curvature R and the same width D can be formed on the surface 1602 of the substrate by causing a plurality of the rigid spheres 1603 having substantially the same radius R, to simultaneously or successively fall from substantially the same height h.

Figure 5:
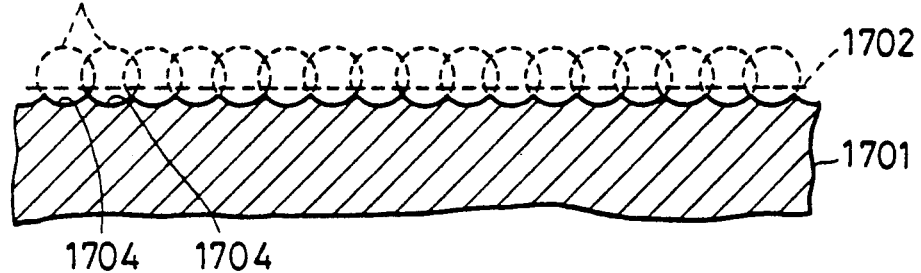
FIG. 5 is an explanatory view showing a further example of the uneven shape of a substrate.

FIG. 5 shows a typical example of the substrates formed with irregularities comprising a plurality of spherical dimples formed on the surface thereof as described above.

The radius of curvature R and width D of each of the spherical dimples which form the irregular form of the surface of the substrate of the electrophotographic light-receiving member of the invention are important factors for efficiently achieving the effect of preventing the occurrence of interference fringe pattern which is confirmed in the image printed by the light-receiving member according to the present invention. As a result of experiments performed by the inventors, the inventors found the following facts:

When the radius R of curvature and width D satisfy the following equation:

$$\frac{D}{R} \geq 0.035$$

at least 0.5 Newton ring is produced in each of the dimples by the shearing interference.

When R and D satisfy the following equation:

$$\frac{D}{R} \geq 0.055$$

at least one Newton ring is produced in each of the dimples by the shearing interference.

This finding shows that the D/R value is at least 0.035, preferably at least 0.055, for dispersing the interference fringes produced in the whole light-receiving member in each of the dimples, thereby preventing the occurrence of interference fringes confirmed in the image printed by using the light-receiving member.

The width D of each of the dimples which form irregularities is at most about 500 µm, preferably 200 µm or less, more preferably 100 µm or less.

In the present invention, the photoconductive layer 103 which is formed on the substrate 101 and which partially forms the light-receiving layer 102 has the semiconductor properties below and is made of A-Si (H,X) showing photoconductivity for the light applied thereto.

(1) p-type A-Si (H,X)—containing an acceptor only or both the acceptor and a donor in which the relative content of the acceptor is higher.
(2) $p^-$-type A-Si (H,X)—in Type (1), the content (Na) of the acceptor is lower, or the relative content of the acceptors is lower.
(3) $n^-$-containing a donor only or both the donor and an acceptor in which the relative content of the donor is higher.
(4) $n^-$-type A-Si (H,X)—in Type (3), the content (Nd) of the donor is lower, or the relative content of the acceptor is lower.
(5) i-type A-Si (H,X)—Na$\simeq$Nd$\simeq$O or Na$\simeq$Nd In the present invention, F, Cl, Br and I are preferable as a halogen atom (X) contained in the photoconductive layer 103, and F and Cl are particularly preferable.

In the present invention, the photoconductive layer 103 made of A-Si (H,X) is formed by a vacuum deposition method which employs a discharge phenomenon, for example, a glow discharge process, a microwave discharge process, a sputtering process, an ion plating process or the like. For example, when an amorphous layer made of A-Si (H,X) is formed by the glow discharge process, Si supplying raw material gas which can supply silicon atoms (Si) and raw material gas for supplying hydrogen atoms (H) and/or halogen atoms (X) are introduced into a deposition chamber in which the pressure can be reduced, and glow discharge is induced in the deposition chamber so that the layer of A-Si (H,X) is formed on a predetermined surface of a substrate placed at a predetermined position. When such a layer is formed by the sputtering process, gas for supplying hydrogen atoms (H) and/or halogen atoms (X) may be introduced into a sputtering deposition chamber during sputtering of a Si target in an atmosphere of inert gas such as Ar, He or the like or a gas mixture based on the inert gases.

Examples of gases that are effectively used as raw material gases for supplying Si in the present invention include silicon hydrides (silanes) such as $SiH_4$, $Si_2H_6$, $Si_3H_8$, and the like, all of which are gaseous or can be gasified. $SiH_4$ and $Si_2H_6$ are particularly preferable from the viewpoints of ease of handling in the work of forming a layer, high efficiency of Si supply and the like.

Preferable examples of raw material gases effectively used for supplying halogen atoms in the present invention include many halogen compounds such as halogen gas, halides, interhalogen compounds, halogen-substituted silane derivatives and the like, all of which are gaseous or can be gasified.

Silicon compounds which consist of silicon and halogen atoms, which are gaseous or can be gasified and which contain halogen atoms can also be exemplified as effective compounds in the present invention.

Typical examples of halogen compounds that can be preferably used in the present invention include halogen gases such as fluorine, chlorine, bromine, iodine and the like, and interhalogen compounds such as BrF, ClF, $ClF_3$, $BrF_5$, $BrF_3$, $IF_3$, $IF_7$, ICl, IBr and the like.

Typical examples of silicon compounds containing halogen atoms, i.e., halogen-substituted silane derivatives, include silicon halides such as $SiF_4$, $Si_2F_6$, $SiCl_4$, $SiBr_4$ and the like.

When the photoconductive member which is characteristic of the present invention is formed by the glow discharge process using such a silicon compound containing halogen atoms, silicon halide gas used as raw material gas for supplying Si and gases such as Ar, $H_2$, He or the like are introduced, at a predetermined mixing ratio and flow rates, into the deposition chamber for forming the photoconductive layer, and a plasma atmosphere is formed by inducing glow discharge so that the photoconductive layer can be formed on a predetermined substrate. In this embodiment, a predetermined amount of silicon compound gas containing hydrogen atoms may be further mixed with the above gas mixture for the purpose of supplying hydrogen atoms.

The above gases may be used singly or in a mixture of a plurality of gases with a predetermined mixing ratio.

A layer of A-Si (H,X) can be formed by the reaction sputtering or ion plating process. In the sputtering process, a Si target is sputtered in a predetermined gas plasma atmosphere. In the ion plating process, a polycrystal silicon or single crystal silicon received as an evaporation source in an evaporation chamber is heated and evaporated by a resistance heating method or an electron beam (EB) method, and the evaporated substance is passed through a predetermined gas plasma atmosphere.

When the halogen atoms are introduced into the layer formed by the sputtering process or the ion plating process, gas of the halogen compound or silicon compound containing halogen atoms may be introduced into the deposition chamber to form a plasma atmosphere of the gas.

When hydrogen atoms are introduced into the layer, raw material gas for supplying hydrogen atoms, e.g., $H_2$ or the above silanes, may be introduced into the sputtering deposition chamber to form a plasma atmosphere of the gas.

In the present invention, although any one of the halogen compounds and halogen-containing silicon compounds is effectively used as raw material gas for supplying halogen atoms, other examples of compounds that can be effectively used as a starting material for forming the photoconductive layer include hydrogen halides such as HF, HCl, HBr, HI and the like, halogen-substituted silicon hydrides such as $SiH_2F_2$, $SiH_2I_2$, $SiH_2Cl_2$, $SiHCl_3$, $SiH_2Br_2$, $SiHRr_3$ and the like, all of which are gaseous or can be gasified and which contain hydrogen atoms as a component.

In the present invention, such halogen compounds containing hydrogen atoms are preferably used as raw materials for supplying halogen atoms because hydrogen atoms which are extremely effective for controlling electrical or photoelectric properties are introduced into the layer at the same time as the introduction of halogen atoms during the formation of the layer.

Halogen atoms can also be structurally introduced into the layer by causing gas of $H_2$ or a silicon halide such as $SiH_4$, $Si_2H_6$, $Si_2H_8$, $Si_4H_{10}$ or the like to coexist with a silicon compound for supplying Si in the deposition chamber and inducing discharge therein.

For example, in the reaction sputtering process, gas for supplying halogen atoms, $H_2$ gas and, if required, inert gas such as He, Ar or the like, are introduced into the deposition chamber, and a plasma atmosphere is formed therein so that a layer of A-Si (H,X) can be formed on a substrate by sputtering the Si target used.

$B_2H_6$ gas or the like may be further introduced for doping the layer with impurities.

The amount of hydrogen atoms (H), the amount of halogen atoms (X) or the total of hydrogen and halogen atoms, which are contained in the photoconductive layer of the electrophotographic light-receiving member formed in the present invention is preferably 1 to 40 atomic %, more preferably 5 to 30 atomic %.

The amount of hydrogen atoms (H) and/or halogen atoms (X) contained in the layer may be controlled by, for example, controlling the temperature of the substrate used and/or the amount of the starting material introduced into the deposition apparatus for introducing hydrogen atoms (H) or halogen atoms (X) in the layer, discharge power or the like.

Preferable examples of dilution gases which are used for forming the photoconductive layer by the glow discharge or sputtering process in the present invention include rare gases such as He, Ne, Ar and the like.

A desired property of the above semiconductor properties 1 to 5 can be imparted to the photoconductive layer 103 by doping the layer formed with n-type impurities, p-type impurities or both types of impurities while controlling the amount of impurities during the formation of the layer.

Preferable examples of p-type impurities include atoms such as B, Al, Ga, In, Tl and the like which belong to the Group III in the Periodic Table. Preferable examples of n-type impurities include atoms such a N, P, As, Sb, Bi and the like which belong to the Group V of the Periodic Table. B, Ga, P and Sb are particularly preferable.

In the present invention, the amount of impurities which are doped in the photoconductive layer 103 for the purpose of obtaining a desired conduction type is appropriately determined according to desired electrical and optical properties. In the case of impurities in the Group III in the Periodic Table, the amount of the impurities doped may be $3 \times 10^{-3}$ atomic % or less. In the case of impurities in the Group V in the Periodic Table, the amount of the impurities doped may be $5 \times 10^{-3}$ atomic % or less.

The photoconductive layer 103 may be doped with impurities by introducing a raw material for introducing impurities into the deposition chamber together with the main raw material used for forming the photoconductive layer 103 during formation thereof. It is desirable to use as such raw material for introducing impurities a substance which is gaseous at room temperature and atmospheric pressure and which can easily be gasified at least under conditions for forming the layer.

It is also desirable to appropriately combine A-Si (H,X) of the types selected from the types (1) to (5) of the A-Si (H,X) layer in view of charge polarity or the like, as occasion demands.

Typical examples of starting materials used for introducing impurities include $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_5H_{12}$, $B_4H_{14}$, $AlCl_3$, $GaCl_3$, $InCl_3$, $TlCl_3$ and the like.

For example, when the photoconductive layer is formed by the glow discharge process, in order to contain atoms of at least one kind of carbon, oxygen and nitrogen atoms, in the photoconductive layer, a compound containing at least one kind of carbon, oxygen and nitrogen atoms may be introduced, together with the raw material gas for forming the photoconductive layer, into the deposition chamber which allows the pressure to be decreased, and glow discharge may be induced in the deposition chamber so that the photoconductive layer can be formed.

Examples of carbon-containing compounds that can be used as raw material for introducing carbon atoms include saturated hydrocarbons having 1 to 4 carbon atoms, hydrocarbons of ethylene series having 2 to 4 carbon atoms, hydrocarbons of acetylene series having 2 to 3 carbon atoms and the like.

Typical examples of such saturated hydrocarbons include methane ($CH_4$), ethane ($C_2H_6$), propane ($C_3H_8$), n-butane ($n-C_4H_{10}$), pentane ($C_5H_{12}$) and the like. Typical examples of hydrocarbons of ethylene series include ethylene ($C_2H_4$), propylene ($C_3H_6$), butene-1 ($C_4H_8$), butene-2 ($C_4H_8$), isobutylene ($C_4H_8$), pentene ($C_5H_{10}$) and the like. Typical examples of hydrocarbons of acetylene series include acetylene ($C_2H_2$), methylacetylene ($C_3H_4$), butyne ($C_4H_6$) and the like.

Alkyl silicides such as $Si(CH_3)_4$, $Si(C_2H_4)_4$ and the like can be exemplified as raw material gas consisting of Si, C and H atoms.

Examples of oxygen-containing compounds that can be used as raw material for introducing oxygen atoms include oxygen ($O_2$), carbon monoxide (CO), carbon dioxide ($CO_2$), nitrogen monoxide, nitrogen dioxide and the like.

Examples of nitrogen-containing compounds that can be used as raw material for introducing nitrogen atoms include nitrogen ($N_2$), nitrogen monoxide, nitrogen dioxide, ammonia and the like.

For example, when the photoconductive layer is formed by the sputtering process, sputtering may be performed by using a sputtering target made of a mixture of $(Si+Si_3N_4)$, $(Si+SiC)$, or $(Si+SiO_2)$ with a desired mixing ratio or using a target comprising a Si wafer and a $Si_3N_4$ wafer, a Si wafer, a SiC wafer or a Si wafer and a $SiO_2$ wafer. Alternatively, the photoconductive layer may be formed by sputtering Si or a target in the deposition chamber in which gas of a compound containing carbon, nitrogen or oxygen is introduced together with sputtering gas such as Ar gas or the like.

Since the amount of carbon, oxygen or nitrogen which is contained in the photoconductive layer formed in the present invention has a significant effect on the characteristics of the electrophotographic light-receiving member produced, the amount must be appropriately determined according to demands. However, the amount is preferably 0.0005 to 30 atomic %, more preferably 0.001 to 20 atomic %, most preferably 0.002 to 15 atomic %.

The thickness of the photoconductive layer 103 is appropriately determined according to desire so that the photocarriers generated by irradiation of light having desired spectral properties are efficiently transported. The thickness is generally 1 to 100 µ, preferably 2 to 50 µ.

The surface layer 104 formed on the photoconductive layer 103 has the free surface 105 which is provided for achieving the objects of the present invention with respect to the humidity resistance, continuous repeated service properties, electrical voltage resistance, working environmental properties and durability.

In addition, in the present invention, since the amorphous materials respectively used for forming the photoconductive layer 103 and the surface layer 104, which form the light-receiving layer 102, have a common component, i.e., silicon atoms, chemical stability is sufficiently ensured at the interface between both layers.

As a matter of course, there is no clear interface between the photoconductive layer 103 and the surface layer 104. Namely, the content of the carbon atoms in the photoconductive layer 103 may be gradually increased from the outer side thereof so that a desired ratio of bonding between silicon and carbon atoms is attained at least in the region on the surface side.

Having no clear interface between the photoconductive layer 103 and the surface layer 104 is preferable when coherent light such as laser beams or the like is used as a light source because the refractive index is changed or reflection is produced at the interface.

The numerical range of the thickness of the layer according to the invention is also an important factor for effectively achieving the object of the invention.

The numerical range of the thickness of the layer according to the invention is appropriately determined according to the desired purposes so that the objects of the invention can be effectively achieved.

In regard to the thickness of the photoconductive layer 103, it is also necessary to appropriately determine the thickness of the surface layer 104 according to desire on the basis of the organic connection corresponding to the properties required for each of the layer regions. In addition, it is preferable to consider economy including productivity and mass productivity.

The thickness of the surface layer 104 in the present invention is generally 0.003 to 30 $\mu$, preferably 0.004 to 20 $\mu$, and more preferably 0.005 to 10 $\mu$. When no clear interface is present between the photoconductive layer 103 and the surface layer 104, the thickness of the region of $\alpha\text{-}(Si_xC_yO_z)_tH_uF_v$ within the above range may be considered as the thickness of the surface layer 104 for convenience's sake.

The thickness of the light-receiving layer of the electrophotographic light-receiving member 100 in the present invention is appropriately determined so as to meet the desired purpose.

In the present invention, the thickness of the light-receiving layer 102 is appropriately determined on the basis of the relation between the thicknesses of the photoconductive layer 103 and the surface layer 104 so as to make effective use of each of the properties imparted to the photoconductive layer 103 and the surface layer 104, both of which form the light-receiving layer 102, and effectively achieve the object of the present invention. The thickness of the light-receiving layer 102 is preferably determined so that the thickness of the photoconductive layer 103 is at least several thousand times the thickness of the surface layer 104.

The typical value of the thickness is generally 3 to 100 $\mu$, preferably 5 to 70 $\mu$, and more preferably 5 to 50 $\mu$.

In the electrophotographic light-receiving member of the present invention, an adhesive layer made of an amorphous material such as $Si_3H_4$, $SiO_2$, SiO or the like, which contains at least one of hydrogen and halogen atoms, at least one of nitrogen and oxygen atoms and a silicon atom, may be provided between the substrate 101 and the photoconductive layer 103 for the purpose of further improving the adhesion therebetween.

It is also preferable to provide a layer or region containing Ge on the side of the substrate for the purpose of effectively absorbing light with a long wavelength such as infrared laser beams.

As described above, the surface layer 104 may be made of a non-single crystal material [A- $(Si_xC_yO_z)_tH_uF_v$] containing silicon, carbon, oxygen, fluorine and hydrogen atoms. In this case, an attempt can be made to improve a measure against filming.

The surface layer 104 made of A- $(Si_xC_yO_z)_tH_uF_v$ can also be formed by the RF discharge process, the microwave discharge process, the sputtering process or the like. However, in any one of the processes, as described above, the layer is formed by controlling reaction so that the ratios of the number of silicon atoms each having at least one bond to a carbon atom and the number of silicon atoms each having at least one bond to an oxygen atom relative to the total number of silicon atoms in the surface layer are different from those in conventional members.

Like the RF discharge process and microwave discharge process, an example of the methods of controlling the bonding of silicon atoms in the plasma CVD process is a method of selecting the types of raw material gases and employing the ions produced by applying an electrical field during discharge.

In a method of controlling the reaction so that the number of silicon atoms each having at least one bond to a carbon atom in the surface layer relative to the total silicon atoms therein is greater than a conventional value, it is particularly effective for the microwave discharge process to use as raw material gases silicon-containing gas such as silane ($SiH_4$), silicon tetrafluoride ($SiF_4$) or the like, and/or carbon-containing gas such as methane ($CH_4$), carbon tetrafluoride ($CF_4$) or the like and an alkyl silicide such as tetramethylsilane ($Si(CH_3)_4$), tetraethylsilane ($Si(C_2H_4)_4$ or the like.

Its is also effective to excite the gas used as carbon-containing gas and having a double or triple bond, together with silicon-containing gas, by using light, an electrical field or the like.

In the microwave discharge process, the controlling effect is improved by applying an electrical field to the discharge space so as to effectively bring ions near the surface of the substrate in the above method.

Under these conditions, the supply of the raw material gas containing oxygen atoms permits control of the reaction so that the ratio by number of silicon atoms each having at least one bond to an oxygen atom to the total silicon atoms in the surface layer is greater than that obtained by discharge simply using microwave. This phenomenon can be more effectively performed by changing the material gas used for supply oxygen.

In the present invention, at least one gas containing hydrogen atoms and at least one gas containing fluorine atoms are used as raw material gases for providing hydrogen and fluorine atoms in surface layer 104. Examples of gases containing hydrogen atoms include silane ($SiH_4$), methane ($CH_4$), hydrogen ($H_2$) and the like. Examples of gases containing fluorine atoms include silicon tetrafluoride ($SiF_4$), carbon tetrafluoride ($CF_4$) and the like.

As a method of controlling reaction so that the ratio by number of silicon atoms each having at least one bond to a carbon atom in the surface layer to the total silicon atoms therein is small, it is effective for the microwave discharge process to use saturated bond species in which a plurality of silicon atoms or carbon atoms are combined. For example, disilane ($Si_2H_6$), disilicon hexafluoride ($Si_2F_6$) or the like is used as the raw material gas for silicon atoms, and ethane ($C_2H_6$), propane ($C_3H_8$) or the like is used as the raw material gas for carbon atoms.

When oxygen atoms are further contained in the layer, it is also preferable to determine the amount of the alkyl silicide introduced relative to the total amount of the silicon-containing gas and carbon-containing gas which are introduced into the film-forming space so as to be within the above-described range. However, if the ratio of bonding between oxygen and silicon atoms is within a desired range, there is no need for controlling the amount of the alkyl silicide introduced so that it is within the above range.

As a method of controlling reaction so that the ratio by number of carbon atoms each having at least one bond to an oxygen atom in the surface layer to the total carbon atoms therein is greater than conventional values, it is effective for the microwave discharge process to use silicon-containing gas such as silane ($SiH_4$), silicon tetrafluoride ($SiF_4$) or the like, and/or oxygen-containing gas such as oxygen ($O_2$), water ($H_2O$), nitrogen monoxide (NO) or the like and a compound such as carbon monoxide (CO), carbon dioxide ($CO_2$), ethyl ether ($CH_3$)$_2$O or the like, which contain both carbon and oxygen.

In the present invention, examples of dilution gases that can be used for forming the surface layer include hydrogen ($H_2$), argon (Ar), helium (He) and the like.

It is also effective for the present invention to introduce a nitrogen-containing gas such as nitrogen ($N_2$), ammonia ($NH_3$), or the like, a fluorine compound such as germanium tetrafluoride ($GeF_4$), nitrogen fluoride ($NF_3$) or the like, a gas mixture thereof or dopant gases such as diborane ($B_2H_6$), boron fluoride ($BF_3$), phosphine ($PH_3$) or the like during the formation of the surface layer 104.

The surface layer 104 according to the present invention is carefully formed in consideration of the ratio of bonds between silicon and carbon atoms and the ratio of bonds between silicon and oxygen atoms or both ratios and the ratio of bonds between carbon and oxygen atoms so that the required properties are obtained according to demands.

Namely, substances consisting of Si, C, O, F and H respectively have structural forms ranging from crystal to amorphous, electrical properties ranging from conductive to semiconductive and insulative, and properties ranging from photoconductive to non-photoconductive, depending upon the conditions for formation thereof. In the present invention, therefore, the conditions for formation of A-$(Si_xC_yO_z)_tH_uF_v$ are strictly selected according to desire so that the substance having desired properties is formed in correspondence with the desired purpose.

For example, if the surface layer 104 is provided for the purpose of improving the voltage resistance, A-$(Si_xC_yO_z)_tH_uF_v$ is formed as a non-single crystal material showing significant electrical insulating behavior in the working environment.

If the surface layer 104 is provided for the purpose of improving the continuous repetitive working properties and working environmental properties, A-$(Si_xC_yO_z)_tH_uF_v$ is formed as a non-single crystal material having a degree of electrical insulating properties which is decreased to some extent and a certain degree of sensitivity to the light applied thereto.

When the surface layer 104 made of A-$(Si_xC_yO_z)_tH_uF_v$ is formed on the surface of the photoconductive layer 103, the temperature of the substrate during the formation of the layer is an important factor which influences the structure and properties of the layer formed. In the present invention, it is preferable to carefully control the temperature of the substrate during the formation of the layer so that A-$(Si_xC_yO_z)_tH_uF_v$ having the intended properties can be formed according to desire.

In order to effectively achieve the object of the present invention, the temperature of the substrate during the formation of the surface layer 104 is appropriately selected from the optimum temperature range for the method of forming the surface layer 104. The temperature of the substrates is generally 50° to 400° C., preferably 100° to 350° C. It is advantageous for forming the surface layer 104 to employ the glow discharge presses or the sputtering process because the precise control of the component ratios of the constituent atoms of the layer and the control of the thickness of the layer are relatively easy, as compared with other processes. However, when the surface layer 104 is formed by the above process, the discharge power and gas pressure during formation of the layer are important factors which influence the properties of A-$(Si_xC_yO_z)_tH_uF_v$ formed, like the temperature of the substrate.

The condition of the discharge power for effectively forming, with high productivity, A-$(Si_xC_yO_z)_tH_uF_v$ having properties which enable the achievement of the object of the invention is generally 10 to 5,000W, preferably 20 to 2,000W, per substrate. In the RF discharge process, the gas pressure in the deposition chamber is generally 0.01 to 2 Torr, preferably 0.1 to 1 Torr. In the microwave discharge process, the gas pressure is generally 0.2 to 100 mTorr, preferably about 1 to 50 mTorr.

Although the preferable numerical ranges of the temperature of the substrate and the discharge power for forming the surface layer 104 in the invention are described above, the factors for forming the layer are not separately determined, but the optimum value of each of the factors for forming each layer is preferably determined on the basis of the mutual organic connection so that the surface layer of A-$(Si_xC_yO_z)_tH_uF_v$ having desired properties can be formed.

The amount of hydrogen atoms contained in the surface layer 104 of the electrophotographic light-receiving member in the invention is generally 41 to 70 atomic %, preferably 45 to 60 atomic %, of the total constituent atoms. When the hydrogen content is within the above ranges, the light-receiving member formed is significantly superior to conventional members in practical use and thus can be satisfactorily used.

Namely, it is generally know that the properties of the electrophotographic light-receiving member are adversely affected by the defects (mainly dangling bonds of silicon and carbon atoms) which are present in the surface layer made of A-$(Si_xC_yO_z)_tH_uF_v$. For example, the charge properties are deteriorated due to the injection of charge from the free surface or changed due to changes in the surface structure in the working environment, e.g., under high humidity. The after image phenomenon occurs during repetitive use due to trapping of charge in the defects of the surface layer from the photoconductive layer during corona discharge or irradiation of light.

However, the amount of the defects in the surface layer can be significantly decreased by controlling the hydrogen content in the surface layer to be at least 41 atomic %. As a result, all the above-described problems can be solved, and the electrical properties and high-speed continuous usability can be significantly improved, as compared with conventional members.

On the other hand, if the hydrogen content in the surface layer exceeds 70 atomic %, the hardness of the surface layer is decreased, and thus the member cannot sufficiently resist repetitive use. It is therefore important for obtaining excellent electrophotographic properties to control the hydrogen content in the surface layer so that the content is within the above range. The hydrogen content in the surface layer can be controlled by using the flow rate of $H_2$ gas, the temperature of the substrate, the discharge power, the gas pressure or the like.

The content of fluorine atoms in the surface layer is generally from about 0.1 to 10 atomic %, preferably from about 0.6 to 4 atomic %. The content of fluorine atoms in the surface layer is at least about 0.1 atomic % or more, so that the bonds between silicon and carbon atoms can be effectively produced in the surface layer. The fluorine atoms in the film function to effectively prevent the bonds between silicon and carbon atoms from being severed due to damage caused by the corona or the like.

On the other hand, if the content of fluorine atoms in the surface layer exceeds about 10 atomic %, there is almost no recognizable enhancement in the production of bonds between the silicon and carbon atoms in the surface layer and there is effective prevention of the severing of bonds between the silicon and carbon atoms (primarily due to the damage caused by corona or the like). In addition, since the presence of excessive amounts of fluorine atoms can inhibit the movement of carriers in the surface layer, a significant residual potential or image memory can be produced. It is, therefore, very important for obtaining the desired enhanced electrophotographic properties to control the content of fluorine atoms in the surface layer to be preferably within the above range. The content of fluorine atoms in the surface layer can be controlled by controlling the flow rate of fluorine-containing gas, such as silicon tetrafluoride or the like, the temperature of the substrate, the discharge power, the gas pressure or the like.

It the atomic composition of the surface layer in the present invention is expressed by the formula A- $(Si_qC_rO_s)_tH_uF_v$ it is preferable that q is 0.1 to 0.4, r is 0.4 to 0.7, s is 0.05 to 0.2 (wherein $q+r+s=1$), t is 0.3 to 0.59, u is 0.41 to 0.7, v is 0.001 to 0.1 (wherein $t+u+v=1$). In the present invention, however, any atoms other than the above atoms can be contained in the surface layer so far as the contents are low (preferably 10 atomic % or less, more preferably 3 atomic % or less, and most preferably 1 atomic % or less).

If the composition of the surface layer is beyond the above ranges, any one of the strength, transparency, durability and weathering resistance of the surface layer deteriorates, and the effect of the present invention are significantly decreased.

In the present invention, the bonding state of silicon atoms in the surface layer is a very important factor. In order to obtain the objects of the invention, the content of the silicon atoms each having at least one bond to a carbon atom is within the range of 50 to 100%, preferably 60 to 100%, and more preferably 70 to 100%, of the total number of silicon atoms in the surface layer, and the content of the silicon atoms each having at least one bond to an oxygen atom is preferably within the range of 10 to 30% of the total number of silicon atoms in the surface layer.

If the bonding state is beyond any one of the above ranges, the effect of the present invention, particularly, the effect of preventing toner filming, deteriorates.

In addition, the content of carbon atoms each having at least one bond to an oxygen atom is within the range of 10 to 30% of the total number of carbon atoms in the surface layer so that the objects of the invention, particularly, the object of preventing toner filming, can be more satisfactorily achieved.

In the present invention, the numerical range of the thickness of the layer is an important factor for effectively achieving the object of the invention. Although any numerical range can be selected as the range of the thickness of the surface layer (or the surface-side region) 104 made of A- $(Si_qC_rO_s)_tH_uF_v$ which satisfies the above relations according to the desired properties, a preferable range is 10 to 500 Å. Namely, if the thickness is less than 10 Å, the objects of the present invention are insufficiently obtained and the surface layer is sometimes lost due to abrasion or the like during the use of the light-receiving member. If the thickness exceeds 500 Å, the electrophotographic properties sometimes deteriorate, for example, the residual potential is increased.

In the present invention, it is also effective for further improving the properties such as the chargeability or the like by providing a blocking layer (lower surface layer) or a blocking region (lower surface region), which is made of SiC (H,X) and which contains oxygen atoms in a reduced amount, between the photoconductive layer and the surface layer or in the surface layer.

In the electrophotographic light-receiving member of the present invention, an adhesive layer made of $Si_3N_4$, $SiO_2$, SiO or a non-single crystal material containing at least one of hydrogen and halogen atoms, at least one of nitrogen and oxygen atoms and a silicon atom may be provided between the substrate 101 and the photoconductive layer 103 for the purpose of further improving the adhesion therebetween, like the above-described example.

In the embodiment of the surface layer 104 made of A- $(Si_qC_rO_s)_tH_uF_v$, the component ratios may be gradually changed so that no clear interface is present between the photoconductive layer 103 and the surface layer 104 to obtain the surface layer 104 having the desired component ratios.

As a matter of course, in this embodiment, the production conditions are selected so as to satisfy each of the above requirements.

A description will now be made of the method of producing the photoconductive member by the microwave discharge process.

Figure 6:
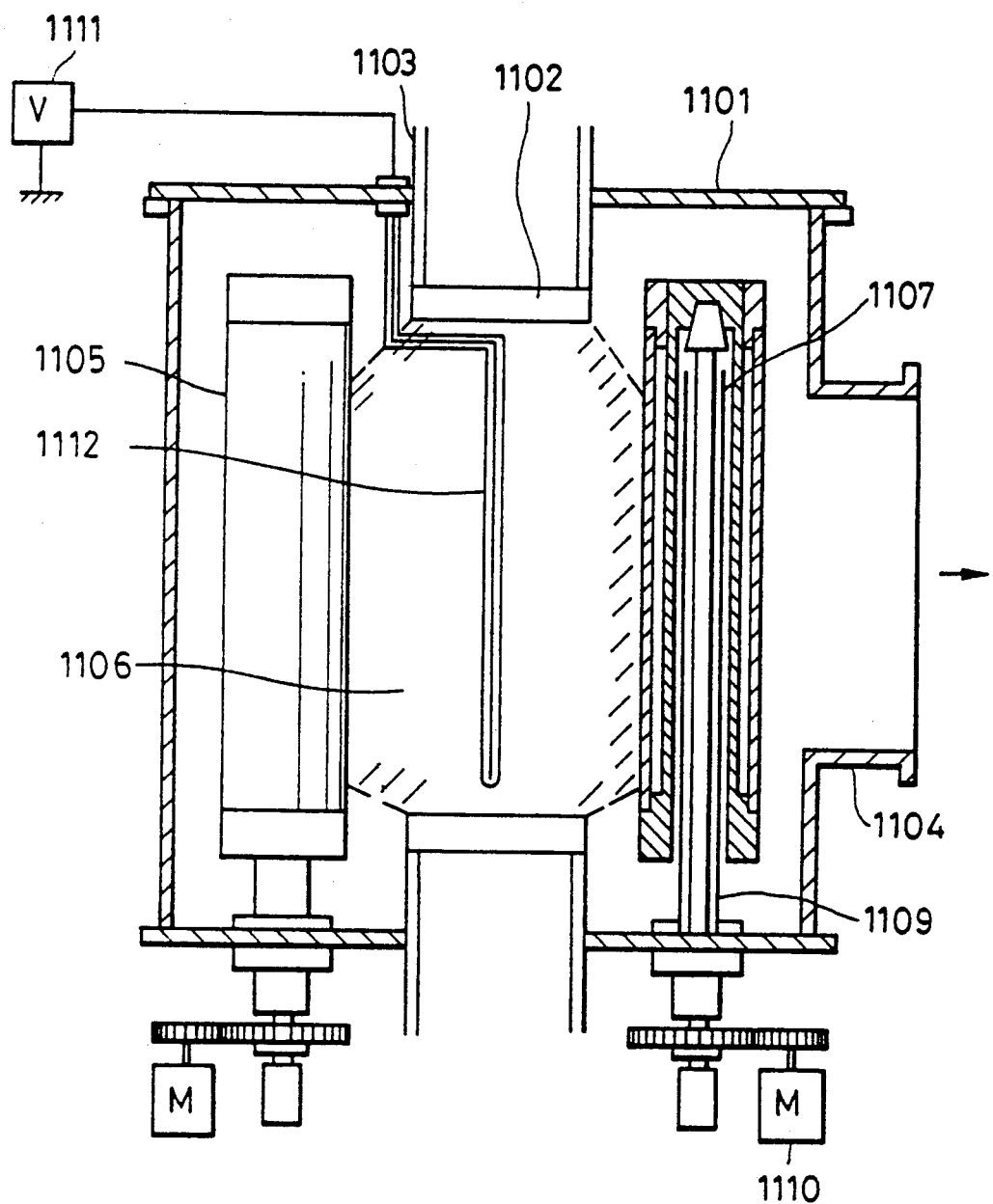
FIG. 6 is a schematic drawing showing an example of apparatuses for producing a drum by microwave discharge for forming a light-receiving layer of an electrophotographic light-receiving member according to the present invention.
Figure 7:
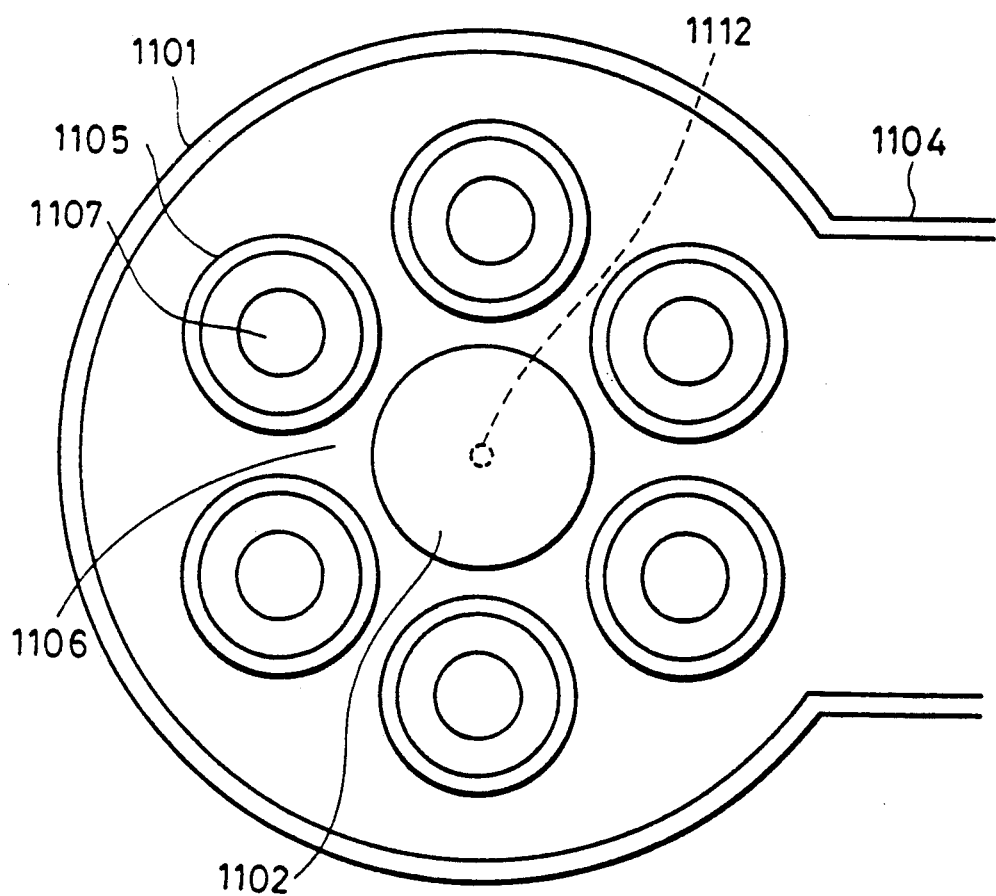
FIG. 7 is a plan view of the production apparatus shown in FIG. 6.
Figure 8:
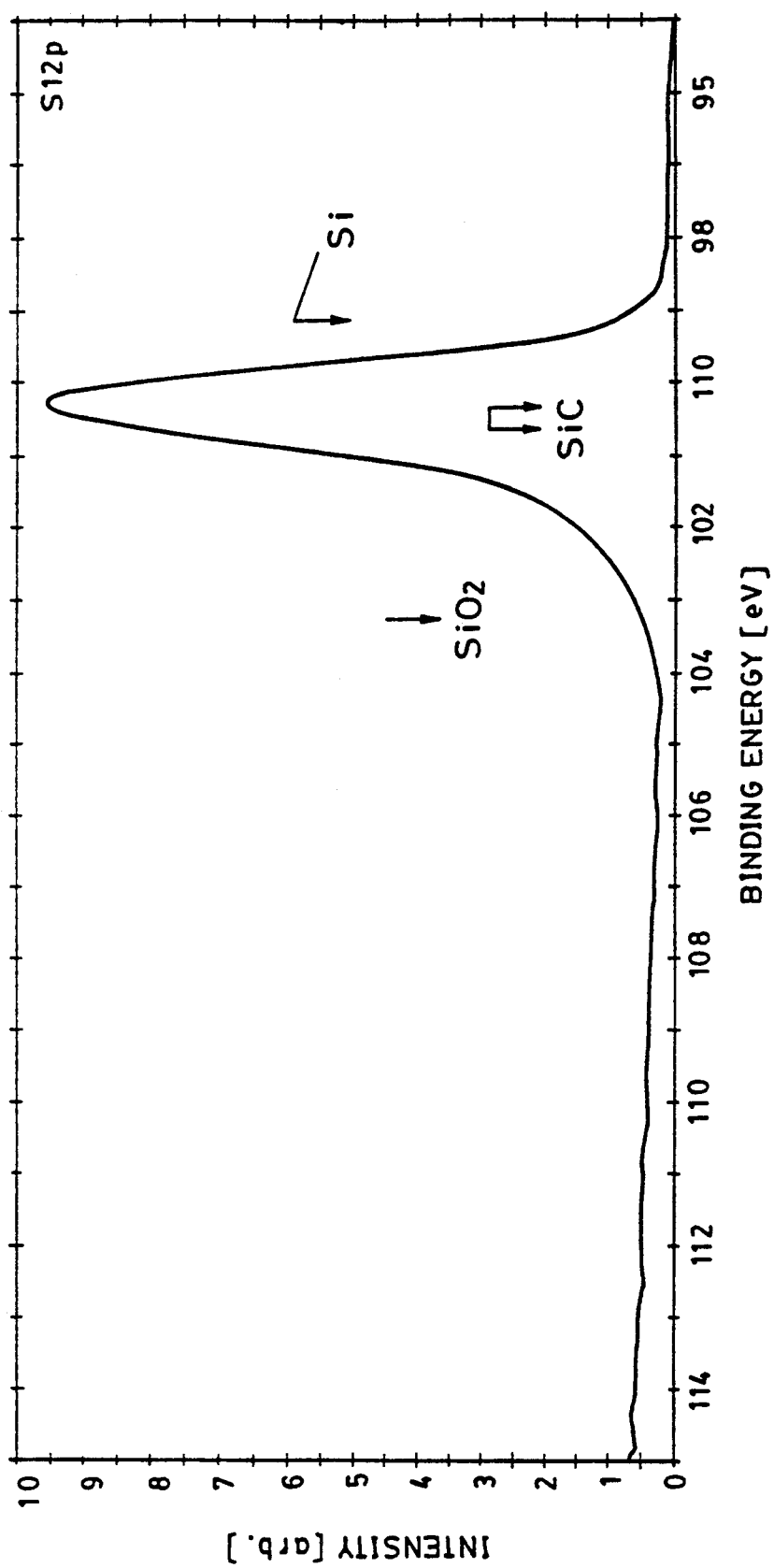

FIGS. 6 and 7 show the apparatus for producing the electrophotographic light-receiving member by the microwave discharge process using a cylindrical substrate. In the drawings, reference numeral 1101 denotes a reactor having a structure which can be made airtight under vacuum. Reference numeral 1102 denotes a microwave introducing dielectric window which efficiently transmits microwave power to the reactor 1101, and which is made of a material (for example, quartz glass, alumina ceramics or the like) which can hodl the airtight vacuum state. Reference numeral 1103 denotes a waveguide for transmitting microwave power which comprises a rectangular portion extended from a microwave power source to a position near the reactor 1101 and a cylindrical portion inserted into the reactor 1101. The waveguide 1103 is connected to the microwave power source (not shown) together with a stab tuner (not shown) and an isolator (not shown). The dielectric window 1102 is hermetically sealed to the inner wall of the cylindrical portion of the waveguide 1103 so as to hold the atmosphere in the reactor 1101. Reference numeral 1104 denotes an exhaust pipe having an end opened to the reactor 1101 and the other end communicating with an exhauster (not shown). Reference numeral 1106 denotes a discharge space surrounded by substrates 1105. A power source 1111 is a DC power source (bias power source) and is electrically connected to an electrode 1112 for the purpose of applying a DC voltage to the bias electrode 1112.

The electrophotographic light-receiving member is produced by the above production apparatus according to the method below. The air in the reactor 1101 is exhausted by a vacuum pump (not shown) through the exhaust pipe 1104 so that the pressure in the reactor 1101 is adjusted to $1 \times 10^{-7}$ Torr or less. Each of the substrates 1105 is then heated to a predetermined temperature by a heater 1107. Raw material gases for a first layer are introduced through gas introducing means (not shown). Namely, raw material gases such as silane gas as raw material gas for A-Si (H,X), diborane gas as doping gas and helium gas as dilution gas are introduced into the reactor 1101. At the same time, a microwave with a frequency of 2.45 GHz is generated from the microwave power source (not shown) and introduced into the reactor 1101 through the microwave introducing dielectric window 1102 through the waveguide 1103. A DC voltage is applied to the bias electrode 1112 from the DC power source 1111 electrically connected to the bias electrode 1112 in the discharge space 1106 so as to be applied to the substrates 1105. The raw material gases in the discharge space 1106 surrounded by the substrates 1105 are thus excited and dissociated by the energy of the microwave. The substrates 1105 are stationarily subjected to ion impact by the electrical field between the bias electrode 1112 and the substrates 1105 to form a first layer region on the surface of each of the substrates 1105. During this time, each of the substrates 1105 is rotated around the axis in the direction of the generating line thereof by using a motor for rotating a rotation shaft 1109 on which each of the substrates 1105 is installed so that a deposited film layer is uniformly formed over the whole periphery of the substrates 1105.

When the second layer region is formed on the thus-formed first layer region, discharge is started by the same method as that employed for forming the first layer region with the exception that the composition of raw material gas introduced into the reactor 1101 is changed to, for example, silane gas, methane gas, silicon tetrafluoride gas, tetramethylsilane gas and, if required, hydrogen gas as dilution gas.

The amount of carbon atoms contained in the second layer region formed can be controlled by, for example, changing the ratio between the flow rates of silane gas and methane gas which are introduced into the discharge space. The state of bonding of silicon atoms can be arbitrarily controlled by displacing silane gas and methane gas by tetramethylsilane gas. In addition, the bonding state can be more effectively controlled by changing the bias voltage applied to the discharge space. The amount of the hydrogen atoms contained in the second layer region can be controlled according to desire by, for example, arbitrarily changing the flow rate of hydrogen gas introduced into the discharge space.

When a second layer region containing oxygen atoms is formed on the first layer region formed, discharge is started by the same method as that employed for forming the first layer region with the exception that the composition of raw material gas introduced into the reactor 1101 is changed to, for example, silane gas, methane gas, tetramethylsilane gas, oxygen gas, nitrogen monoxide gas and, if required, hydrogen gas as dilution gas.

The amount of carbon atoms or oxygen atoms contained in the second layer region formed can be controlled by, for example, changing the ratio among the flow rates of silane gas, methane gas and oxygen gas which are introduced into the discharge space. The state of bonding of silicon atoms can be arbitrarily controlled by displacing silane gas and methane gas by tetramethylsilane gas and oxygen gas by nitrogen monoxide gas. The state of bonding carbon atoms can be arbitrarily controlled by displacing methane gas and oxygen gas by methyl ether gas. In addition, the bonding state can be more effectively controlled by changing the bias voltage applied to the discharge space. The amounts of the hydrogen and fluorine atoms contained in the second layer region can be controlled according to desire by, for example, arbitrarily changing the flow rates of hydrogen gas and silicon tetrafluoride gas introduced into the discharge space.

EXAMPLE 1

An electrophotographic light-receiving member was formed on a planished aluminum cylinder by using the production apparatus shown in FIGS. 6 and 7. The conditions for the formation of a photoconductive layer and a surface layer were as shown in Table 1. In regard to the surface layer, the flow rates of silane gas, methane gas and tetramethylsilane gas were changed for changing the ratio of silicon atoms bonded to carbon atoms to produce light-receiving members (referred to as "drums" hereinafter) under the six different conditions A to F, as shown in Table 2. In addition, separate surface layers only (referred to as "samples" hereinafter) were formed on the same cylinder by using the same apparatus as that shown in FIGS. 6 and 7.

The drum was set in an electrophotographic apparatus (produced by converting NP7550 manufactured by Canon Inc. for tests in the invention). The initial electrophotographic properties such as chargeability, sensitivity, image flowing in high-humidity environment (atmospheric temperature: 31° C., humidity: 85%), residual potential, ghost, image defect and the like were evaluated under various conditions. The drum was then subjected to an endurance test in which printing on 500,000 sheets was performed at atmospheric temperature of 33° C. and humidity 90% without using drum heating means such as a drum heater or the like, and the same evaluation as that performed in the initial stage was performed. The occurrence of toner filming on the surface of the drum which was caused by the endurance test was also evaluated. If required, the amount of the atoms and bonding state of the atoms in the surface layer were also analyzed by ESCA.

A plurality of pieces were cut from portions of each of the samples corresponding to the upper and lower portions of an image portion and subjected to quantitative analysis of the silicon, carbon, oxygen, hydrogen and fluorine atoms, which were contained in the layer, by Auger, SIMS and chemical analysis, as occasion demanded. If required, the amount of the atoms and the bonding state in the surface were also analyzed by ESCA.

Tables 3 and 4 show the results of the evaluation and the initial values obtained by quantitative analysis. In Table 4, the total content of silicon, carbon, oxygen, hydrogen and fluorine atoms is 100 atomic %. It was found from the results that there is a proper ratio of silicon atoms bonded to carbon atoms. The remarkable superiority of the drums was confirmed in the properties after the endurance test in a high-humidity environment.

TABLE 1

| Film-Forming Conditions | Layer Structure | |
|---|---|---|
| | Photoconductive Layer | Surface Layer |
| Raw Gas Flow Rate | | |
| $SiH_4$ | 300 sccm | * |
| $Si(CH_3)_4$ | 0 sccm | * |
| $CH_4$ | 0 sccm | * |
| $(CH_3)_2O$ | 0 sccm | 20 sccm |
| $O_2$ | 0 sccm | 14 sccm |
| NO | 3 sccm | 12 sccm |
| $B_2H_6$ | 50 ppm | 0 ppm |
| $H_2$ | 800 sccm | 1000 sccm |
| $SiF_4$ | 0 sccm | 15 sccm |
| Pressure | 13 mTorr | 13 mTorr |
| Microwave Power | 1000 W | 1000 W |
| Bias Voltage | 70 V | 70 V |
| Layer Thickness | 25 μm | 0.03 μm |

*Shown in Table 2

TABLE 2

| Raw Gas | Sample Name | | | | | |
|---|---|---|---|---|---|---|
| | A | B | C | D | E | F |
| $SiH_4$ (sccm) | 20 | 25 | 30 | 40 | 50 | 60 |
| $Si(CH_3)_4$ (sccm) | 80 | 70 | 60 | 40 | 20 | 0 |
| $CH_4$ (sccm) | 30 | 60 | 90 | 150 | 210 | 270 |

TABLE 3

| Evaluation Item | | Sample Name | | | | | |
|---|---|---|---|---|---|---|---|
| | | A | B | C | D | E | F |
| Initial Properties | Chargeability | ⊚ | ⊚ | ⊚ | ⊚ | ⊚ | ⊚ |
| | Sensitivity | ⊚ | ⊚ | ⊚ | ⊚ | ⊚ | ⊚ |
| | Image Flowing | ⊚ | ⊚ | ⊚ | ⊚ | ⊚ | ⊚ |
| | Residual Potential | ⊚ | ⊚ | ⊚ | ⊚ | ⊚ | ⊚ |
| | Ghost | ⊚ | ⊚ | ○ | ○ | ○ | ○ |
| | Image Defect | ⊚ | ⊚ | ⊚ | ⊚ | ⊚ | ⊚ |
| After Endurance Test at High Humidity | Chargeability | ⊚ | ⊚ | ⊚ | ⊚ | ⊚ | ⊚ |
| | Sensitivity | ⊚ | ⊚ | ⊚ | ⊚ | ⊚ | ⊚ |
| | Image Flowing | ⊚ | ⊚ | ⊚ | ○ | ○ | Δ |
| | Residual Potential | ⊚ | ⊚ | ⊚ | ⊚ | ⊚ | ⊚ |
| | Ghost | ⊚ | ⊚ | ○ | ○ | ○ | ○ |
| | Image Defect | ○ | ○ | ○ | ○ | ○ | ○ |
| | Toner Filming | ⊚ | ⊚ | ○ | Δ | x | x |

Evaluation: ⊚ ... Very good, ○ ... Good, Δ ... No practical difficulty, x ... Not practical.

TABLE 4

| Element | Component Ratio (atomic %) | | | | | |
|---|---|---|---|---|---|---|
| | A | B | C | D | E | F |
| Si (Total) | 12.0 | 11.3 | 12.3 | 12.5 | 13.1 | 12.8 |
| Si (Si—C) | 11.0 | 8.3 | 7.4 | 6.4 | 5.5 | 3.2 |
| Si (Si—O) | 2.8 | 3.0 | 3.1 | 3.2 | 3.0 | 2.8 |
| C (Total) | 24.2 | 24.8 | 23.2 | 22.7 | 22.7 | 22.0 |
| O (Total) | 5.8 | 5.1 | 6.0 | 5.7 | 5.4 | 6.2 |
| H | 56.4 | 56.8 | 56.6 | 57.5 | 57.4 | 57.5 |
| F | 1.6 | 2.0 | 1.9 | 1.6 | 1.8 | 1.5 |

Si (Si—C): Component ratio of Si atoms having Si—C bonding.
Si (Si—O): Component ratio of Si atoms having Si—O bonding.

EXAMPLE 2

An electrophotographic light-receiving member was formed by using the production apparatus shown in FIGS. 6 and 7 in accordance with the same procedure as that in Example 1. The conditions for the formation of a photoconductive layer and a surface layer were as shown in Table 5. In regard to the surface layer, the flow rates of nitrogen monoxide gas and oxygen gas were changed for changing the ratio of silicon atoms bonded to oxygen atoms to produce drums under the six different conditions G to L, as shown in Table 6. In addition, separate surface layers only (referred to as "samples" hereinafter) were formed on the same cylinder by using the same apparatus as that shown in FIGS. 6 and 7.

The drums and samples were evaluated and analyzed in the same manner as those in Example 1.

Tables 7 and 8 show the results of the evaluation and the initial values obtained by quantitative analysis. In Table 8, the total content of silicon, carbon, oxygen, hydrogen and fluorine atoms is 100 atomic %. It was found from the results that there is a proper ratio of silicon atoms bonded to oxygen atoms. The remarkable superiority of the drums was confirmed in the properties after the endurance test in a high-humidity environment.

TABLE 5

| Film-Forming Conditions | Layer Structure | |
|---|---|---|
| | Photoconductive Layer | Surface Layer |
| Raw Gas Flow Rate | | |
| $SiH_4$ | 350 sccm | 25 sccm |
| $Si(CH_3)_4$ | 0 sccm | 70 sccm |
| $CH_4$ | 0 sccm | 60 sccm |
| $O_2$ | 0 sccm | * |
| NO | 3 sccm | * |
| $B_2H_6$ | 50 ppm | 0 ppm |
| $H_2$ | 800 sccm | 1000 sccm |
| $SiF_4$ | 0 sccm | 15 sccm |
| Pressure | 13 mTorr | 13 mTorr |
| Microwave Power | 1000 W | 1000 W |
| Bias Voltage | 70 V | 70 V |
| Layer Thickness | 25 μm | 0.03 μm |

*Shown in Table 6

TABLE 6

| Raw Gas | Sample Name | | | | | |
|---|---|---|---|---|---|---|
| | G | H | I | J | K | L |
| $O_2$ (sccm) | 0 | 6 | 10 | 16 | 18 | 20 |
| NO (sccm) | 40 | 28 | 20 | 8 | 4 | 0 |

TABLE 7

| Evaluation Item | | Sample Name | | | | | | |
|---|---|---|---|---|---|---|---|---|
| | | G | H | I | B | J | K | L |
| Initial Properties | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ⊚ | ⊚ | ⊚ | ⊚ | ⊚ | ⊚ | ⊚ |
| | Residual Potential | ⊚ | ⊚ | ⊚ | ⊚ | ⊚ | ⊚ | ⊚ |
| | Ghost | ○ | ○ | ⊚ | ⊚ | ⊚ | ○ | ○ |
| | Image Defect | ⊚ | ⊚ | ⊚ | ⊚ | ⊚ | ⊚ | ⊚ |
| After Endurance Test at High Humidity | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ○ | ⊚ | ⊚ | ⊚ | ⊚ | ○ | Δ |
| | Residual Potential | ⊚ | ⊚ | ⊚ | ⊚ | ⊚ | ⊚ | ⊚ |
| | Ghost | ○ | ○ | ⊚ | ⊚ | ⊚ | ○ | ⊚ |
| | Image Defect | ○ | ○ | ○ | ○ | ○ | ○ | ○ |
| | Toner Filming | x | Δ | ⊚ | ⊚ | ⊚ | Δ | x |

Evaluation: ⊚ ... Very good, ○ ... Good, Δ ... No practical difficulty, x ... Not practical.

TABLE 8

| Element | Component Ratio (atomic %) | | | | | | |
|---|---|---|---|---|---|---|---|
| | G | H | I | B | J | K | L |
| Si (Total) | 12.5 | 12.0 | 12.3 | 11.3 | 11.3 | 11.0 | 11.5 |
| Si (Si—C) | 9.3 | 8.9 | 8.9 | 8.3 | 9.0 | 8.4 | 8.5 |
| Si (Si—O) | 5.6 | 4.0 | 3.5 | 3.0 | 1.4 | 0.9 | 0.5 |
| C (Total) | 21.8 | 23.3 | 24.1 | 24.8 | 26.0 | 27.3 | 27.6 |
| O (Total) | 7.5 | 6.7 | 5.9 | 5.1 | 5.2 | 4.3 | 4.0 |

TABLE 8-continued

| Element | Component Ratio (atomic %) | | | | | | |
|---|---|---|---|---|---|---|---|
| | G | H | I | B | J | K | L |
| H | 56.0 | 56.0 | 55.9 | 56.8 | 55.4 | 55.4 | 57.6 |
| F | 2.2 | 2.0 | 1.8 | 2.0 | 2.1 | 1.8 | 2.3 |

Si (Si—C): Component ratio of Si atoms having Si—C bonding.
Si (Si—O): Component ratio of Si atoms having Si—O bonding.

EXAMPLE 3

The content of fluorine atoms in the surface layer was changed within the range of the invention to prepare a plurality of analytical samples under the conditions of film formation shown in Table 9. Each of the samples was set in an electrophotographic apparatus (produced by remodeling NP7750 manufactured by Canon Inc. for tests in the invention) and then subjected to corona discharge corresponding to copying of 1,000,000 sheets under the condition that a voltage of 6 kV was applied to a charger. The number of silicon atoms bonded to carbon atoms after the corona discharge was compared with that before the corona discharge.

TABLE 9

| Film-Forming Conditions | Sample Name | | | | | |
|---|---|---|---|---|---|---|
| | M | N | O | P | Q | R |
| Raw Gas Flow Rate (sccm) | | | | | | |
| SiH$_4$ | 34 | 33 | 30 | 11 | 0 | 0 |
| Si(CH$_3$)$_4$ | 70 | 70 | 70 | 70 | 70 | 70 |
| CH$_4$ | 60 | 60 | 60 | 60 | 55 | 35 |
| O$_2$ | 14 | 14 | 14 | 14 | 14 | 14 |
| NO | 12 | 12 | 12 | 12 | 12 | 12 |
| SiF$_4$ | 1.2 | 3 | 7.5 | 36 | 52.5 | 52.5 |
| CF$_4$ | 0 | 0 | 0 | 0 | 7.5 | 37.5 |
| H$_2$ | 1000 | 1000 | 1000 | 1000 | 1000 | 1000 |
| Pressure (mTorr) | 13 | 13 | 13 | 13 | 13 | 13 |
| Microwave Power (W) | 1000 | 1000 | 1000 | 1000 | 1000 | 1000 |
| Bias Voltage (V) | 70 | 70 | 70 | 70 | 70 | 70 |
| Layer Thickness (μm) | 0.03 | 0.03 | 0.03 | 0.03 | 0.03 | 0.03 |

COMPARATIVE EXAMPLES 1 and 2

For comparison with the samples prepared in Example 3, analytical samples were prepared under the production conditions shown in Table 10 and evaluated by the same method as that employed in Example 3.

TABLE 10

| Film-Forming Conditions | Comparative Example 1 | Comparative Example 2 |
|---|---|---|
| Raw Gas Flow Rate (sccm) | | |
| SiH$_4$ | 34 | 0 |
| Si(CH$_3$)$_4$ | 70 | 70 |
| CH$_4$ | 60 | 25 |
| O$_2$ | 14 | 14 |
| NO | 12 | 12 |
| SiF$_4$ | 0.7 | 52.5 |
| CF$_4$ | 0 | 52.5 |
| H$_2$ | 1000 | 1000 |
| Pressure (mTorr) | 13 | 13 |
| Microwave Power (W) | 1000 | 1000 |
| Bias Voltage (V) | 70 | 70 |
| Layer Thickness (μm) | 0.03 | 0.03 |

The results obtained from Example 3 and Comparative Examples 1 and 2 are shown in Table 11.

TABLE 11

| Sample Name | F Content (atomic %) | Evaluation |
|---|---|---|
| Comparative Example 1 | 0.08 | Δ |

TABLE 11-continued

| Sample Name | F Content (atomic %) | Evaluation |
|---|---|---|
| M | 0.10 | ○-Δ |
| N | 0.32 | ○ |
| O | 0.69 | ⊚ |
| P | 3.7 | ⊚ |
| Q | 6.9 | ○ |
| R | 9.6 | ○-Δ |
| Comparative Example 2 | 11.0 | x |

The results of evaluation shown in Table 11 show comparison of the number of silicon atoms bonded to carbon atoms after the corona discharge with that before the corona discharge on the basis of the following criteria:

⊚ ... Substantially no change
○ ... Slight decrease was confirmed.
Δ ... Significant decrease was confirmed, without any trouble in a usual use method
x ... Significant decrease was confirmed, without practicability.

In the table, ○-Δ shows that when the same experiment was repeated several times, both the marks ○ and Δ were obtained as results of evaluation.

EXAMPLE 4

A charge injection inhibition layer, a photoconductive layer and a lower surface layer were formed on a substrate by using the production apparatus shown in FIGS. 6 and 7 under the conditions shown in Table 12, and a surface layer was then formed under the same conditions as those for Sample A of Example 1.

TABLE 12

| Film-Forming Conditions | Layer Structure | | |
|---|---|---|---|
| | Charge Injection Inhibition Layer | Photo-conductive Layer | Lower Surface Layer |
| Raw gas flow rate | | | |
| SiH$_4$ | 350 sccm | 350 sccm | 70 sccm |
| Ne | 100 sccm | 100 sccm | 100 sccm |
| CH$_4$ | 35 sccm | 0 sccm | 350 sccm |
| B$_2$H$_6$ | 1000 ppm | 0 ppm | 0 ppm |
| Pressure | 13 Torr | 13 mTorr | 12 mTorr |
| Microwave Power | 1000 W | 1000 W | 1000 W |
| Bias Voltage | 100 V | 100 V | 100 V |
| Layer Thickness | 3 μm | 20 μm | 0.5 μm |

As a result of evaluation of the drum in the same manner as in Example 1, good results were obtained, in accordance with the drum formed under the conditions for Sample A of Example 1.

EXAMPLE 5

A photoconductive layer was formed under the conditions shown in Table 13, and a surface layer was then formed under the same conditions as those in Sample B of Example 1.

TABLE 13

| Film-Forming Conditions | Layer Structure | | |
|---|---|---|---|
| | Charge Injection Inhibition Layer | Charge Transport Layer | Charge Generating Layer |
| Raw gas flow rate | | | |
| SiH$_4$ | 350 sccm | 350 sccm | 350 sccm |
| Ne | 100 sccm | 100 sccm | 100 sccm |
| CH$_4$ | 35 sccm | 35 sccm | 0 sccm |
| B$_2$H$_6$ | 1000 ppm | 0 ppm | 0 ppm |

TABLE 13-continued

| Film-Forming Conditions | Layer Structure | | |
|---|---|---|---|
| | Charge Injection Inhibition Layer | Charge Transport Layer | Charge Generating Layer |
| Pressure | 11 mTorr | 11 mTorr | 10 mTorr |
| Microwave Power | 1000 W | 1000 W | 1000 W |
| Bias Voltage | 100 V | 100 V | 100 V |
| Layer Thickness | 3 μm | 20 μm | 0.5 μm |

As a result of evaluation of the drum in the same manner as in Example 1, good results were obtained, in accordance with the drum formed under the conditions for Sample B of Example 1.

EXAMPLE 6

A photoconductive layer was formed by the RF discharge process under the conditions shown in Table 14, and a surface layer was then formed by using the production apparatus shown in FIGS. 6 and 7 under the same conditions as those for Sample B of Example 1.

TABLE 14

| Film-Forming Conditions | Layer Structure | |
|---|---|---|
| | Charge Injection Inhibition Layer | Photo-conductive Layer |
| Raw gas flow rate | | |
| SiH$_4$ | 250 sccm | 350 sccm |
| Ne | 250 sccm | 350 sccm |
| CH$_4$ | 0 sccm | 0 sccm |
| B$_2$H$_6$ | 1000 ppm | 0 ppm |
| Pressure | 0.3 mTorr | 0.5 mTorr |
| RF Power | 300 W | 400 W |
| Layer Thickness | 3 μm | 20 μm |

As a result of evaluation of the thus-formed drum in the same manner as in Example 1, good results were obtained, in accordance with the drum formed under the conditions for Sample B of Example 1.

EXAMPLE 7

The same photoconductive layer as that formed in Example 1 was formed, and a surface layer was then formed under the same conditions as those for Sample B of Example 1, while the thickness was changed to a value from 5 Å to 1 μm.

As a result of evaluation of the thus-formed drum in the same manner as in Example 1, good results were obtained from samples comprising the surface layers having thicknesses from 10 Å to 500 Å, in accordance with the drum formed under the conditions for Sample B of Example 1. The advantages of the present invention were thus confirmed.

EXAMPLE 8

The same evaluations as those performed in Examples 1 to 7 were performed, while the contents of silicon, carbon, oxygen, hydrogen and fluorine atoms in the surface layer were changed. As a result, it was confirmed that assuming that the composition of a surface layer is $(Si_xC_yO_z)_tH_uF_v$ (wherein $x+y+z=1$, $t+u+v=1$), when $0.1 \leq x \leq 0.4$, $0.4 \leq y \leq 0.7$, $0.05 \leq z \leq 0.2$, $0.299 \leq t \leq 0.589$, $0.41 \leq u \leq 0.7$, and $0.001 \leq v \leq 0.1$, the drum of the present invention shows good electrophotographic properties. The advantages of the present invention were thus confirmed.

EXAMPLE 9

An electrophotographic light-receiving member was formed on a planished aluminum cylinder by using the production apparatus shown in FIGS. 6 and 7. The conditions for the formation of a photoconductive layer and a surface layer were as shown in Table 15. In regard to the surface layer, the flow rates of silane gas, methane gas and tetramethylsilane gas were changed for changing the ratio of silicon atoms bonded to carbon atoms to produce light-receiving members (referred to as "drums" hereinafter) under the six different conditions A to F, as shown in Table 16. In addition, separate surface layers only (referred to as "samples" hereinafter) were formed on the same cylinder by using the same apparatus as that shown in FIGS. 6 and 7.

The drum was set in an electrophotographic apparatus (produced by converting NP7550 manufactured by Canon Inc. for tests in the invention). The initial electrophotographic properties such as chargeability, sensitivity, image flowing in high-humidity environment (atmospheric temperature: 31° C., humidity: 85%), residual potential, ghost, image defect and the like were evaluated under various conditions. The drum was then subjected to an endurance test in which printing on 500,000 sheets was performed at atmospheric temperature of 33° C. and a humidity of 90% without using drum heating means, such as a drum heater or the like, and the same evaluation as that performed in the initial stage was performed. The occurrence of toner filming on the surface of the drum which was caused by the endurance test was also evaluated. If required, the amount of the atoms and the bonding state of the atoms in the surface layer were also analyzed by ESCA.

A plurality of pieces were cut from portions of each of the samples corresponding to the upper and lower portions of an image portion and subjected to quantitative analysis of the silicon, carbon, oxygen, hydrogen and fluorine atoms, which were contained in the layer, by Auger, SIMS and chemical analysis, as the occasion demanded. If required, the amount of the atoms and the bonding state in the surface were also analyzed by ESCA.

Tables 17 and 18 show the results of the evaluation and the initial values obtained by quantitative analysis. In Table 18, the total content of silicon, carbon, oxygen, hydrogen and fluorine atoms is 100 atomic %. It was found from the results that there is a proper ratio of silicon atoms bonded to carbon atoms. The remarkable superiority of the drums was confirmed in their properties after the endurance test in a high-humidity environment.

TABLE 15

| Film-Forming Conditions | Layer Structure | |
|---|---|---|
| | Photoconductive Layer | Surface Layer |
| Raw Gas Flow Rate | | |
| SiH$_4$ | 300 sccm | * |
| Si(CH$_3$)$_4$ | 0 sccm | * |
| CH$_4$ | 0 sccm | * |
| (CH$_3$)$_2$O | 0 sccm | 20 sccm |
| O$_2$ | 0 sccm | 7 sccm |
| NO | 3 sccm | 6 sccm |
| B$_2$H$_6$ | 50 ppm | 0 ppm |
| H$_2$ | 100 sccm | 400 sccm |
| SiF$_4$ | 0 sccm | 15 sccm |
| Pressure | 8 mTorr | 9 mTorr |
| Microwave Power | 1000 W | 900 W |
| Bias Voltage | 100 V | 120 V |

TABLE 15-continued

| Film-Forming Conditions | Layer Structure | |
|---|---|---|
| | Photoconductive Layer | Surface Layer |
| Layer Thickness | 25 μm | 0.03 μm |

*Shown in Table 16

TABLE 16

| Raw Gas | Sample Name | | | | | |
|---|---|---|---|---|---|---|
| | A | B | C | D | E | F |
| SiH$_4$ (sccm) | 20 | 25 | 30 | 40 | 50 | 60 |
| Si(CH$_3$)$_4$ (sccm) | 80 | 70 | 60 | 40 | 20 | 0 |
| CH$_4$ (sccm) | 0 | 30 | 60 | 120 | 180 | 240 |

TABLE 17

| Evaluation Item | | Sample Name | | | | | |
|---|---|---|---|---|---|---|---|
| | | A | B | C | D | E | F |
| Initial Properties | Chargeability | ⊚ | ⊚ | ⊚ | ⊚ | ⊚ | ⊚ |
| | Sensitivity | ⊚ | ⊚ | ⊚ | ⊚ | ⊚ | ⊚ |
| | Image Flowing | ⊚ | ⊚ | ⊚ | ⊚ | ⊚ | ⊚ |
| | Residual Potential | ⊚ | ⊚ | ⊚ | ⊚ | ⊚ | ⊚ |
| | Ghost | ⊚ | ⊚ | ∘ | ∘ | ∘ | ∘ |
| | Image Defect | ⊚ | ⊚ | ⊚ | ⊚ | ⊚ | ⊚ |
| After Endurance Test at High Humidity | Chargeability | ⊚ | ⊚ | ⊚ | ⊚ | ⊚ | ⊚ |
| | Sensitivity | ⊚ | ⊚ | ⊚ | ⊚ | ⊚ | ⊚ |
| | Image Flowing | ⊚ | ⊚ | ⊚ | ∘ | ∘ | Δ |
| | Residual Potential | ⊚ | ⊚ | ⊚ | ⊚ | ⊚ | ⊚ |
| | Ghost | ⊚ | ⊚ | ∘ | ∘ | ∘ | ∘ |
| | Image Defect | ∘ | ∘ | ∘ | ∘ | ∘ | ∘ |
| | Toner Filming | ⊚ | ⊚ | ∘ | Δ | x | x |

Evaluation: ⊚ ... Very good, ∘ ... Good, Δ ... No practical difficulty, x ... Not practical.

TABLE 18

| Element | Component Ratio (atomic %) | | | | | |
|---|---|---|---|---|---|---|
| | A | B | C | D | E | F |
| Si (Total) | 13.0 | 12.5 | 12.1 | 12.7 | 12.0 | 11.9 |
| Si (Si—C) | 12.0 | 9.0 | 7.3 | 6.6 | 5.1 | 3.0 |
| Si (Si—O) | 2.6 | 2.7 | 3.2 | 2.9 | 2.8 | 3.1 |
| C (Total) | 25.1 | 24.0 | 23.7 | 25.1 | 22.1 | 21.8 |
| C (C—O) | 5.1 | 4.2 | 5.3 | 4.7 | 4.8 | 5.1 |
| O (Total) | 6.1 | 5.3 | 7.0 | 5.8 | 6.2 | 5.5 |
| H | 54.0 | 56.3 | 55.2 | 54.7 | 57.9 | 59.1 |
| F | 1.8 | 1.9 | 2.0 | 1.7 | 1.8 | 1.7 |

Si (Si—C): Component ratio of Si atoms having Si—C bonding.
Si (Si—O): Component ratio of Si atoms having Si—O bonding.
C (C—O): Component ratio of C atoms having C—O bonding.

EXAMPLE 10

An electrophotographic light-receiving member was formed by using the production apparatus shown in FIGS. 6 and 7 in accordance with the same procedure as that in Example 9. The conditions for the formation of a photoconductive layer and a surface layer were as shown in Table 19. In regard to the surface layer, the flow rates of nitrogen monoxide gas and oxygen gas were changed for changing the ratio of silicon atoms bonded to oxygen atoms to produce drums under the six different conditions G to L, as shown in Table 20. In addition, separate surface layers only (referred to as "samples" hereinafter) were formed on the same cylinder by using the same apparatus as that shown in FIGS. 6 and 7.

The drums and samples were evaluated and analyzed in the same manner as that in Example 9.

Tables 21 and 22 show the results of the evaluation and the initial values obtained by quantitative analysis. In Table 22, the total content of silicon, carbon, oxygen, hydrogen and fluorine atoms is 100 atomic %. It was found from the results that there is a proper ratio of silicon atoms bonded to oxygen atoms. The remarkable superiority of the drums was confirmed in the properties after the endurance test in a high-humidity environment.

TABLE 19

| Film-Forming Conditions | Layer Structure | |
|---|---|---|
| | Photoconductive Layer | Surface Layer |
| Raw Gas Flow Rate | | |
| SiH$_4$ | 350 sccm | 25 sccm |
| Si(CH$_3$)$_4$ | 0 sccm | 70 sccm |
| CH$_4$ | 0 sccm | 30 sccm |
| (CH$_3$)$_2$O | 0 sccm | 20 sccm |
| O$_2$ | 0 sccm | * |
| NO | 3 sccm | * |
| B$_2$H$_6$ | 50 ppm | 0 ppm |
| H$_2$ | 100 sccm | 400 ppm |
| SiF$_4$ | 0 sccm | 15 sccm |
| Pressure | 8 mTorr | 9 mTorr |
| Microwave Power | 1000 W | 900 W |
| Bias Voltage | 100 V | 120 V |
| Layer Thickness | 25 μm | 0.03 μm |

*Shown in Table 20

TABLE 20

| Raw Gas | Sample Name | | | | | |
|---|---|---|---|---|---|---|
| | G | H | I | J | K | L |
| O$_2$ (sccm) | 0 | 3 | 5 | 8 | 9 | 10 |
| NO (sccm) | 20 | 14 | 10 | 4 | 2 | 0 |

TABLE 21

| Evaluation Item | | Sample Name | | | | | | |
|---|---|---|---|---|---|---|---|---|
| | | G | H | I | B | J | K | L |
| Initial Properties | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ⊚ | ⊚ | ⊚ | ⊚ | ⊚ | ⊚ | ⊚ |
| | Residual Potential | ⊚ | ⊚ | ⊚ | ⊚ | ⊚ | ⊚ | ⊚ |
| | Ghost | ∘ | ∘ | ⊚ | ⊚ | ⊚ | ∘ | ∘ |
| | Image Defect | ⊚ | ⊚ | ⊚ | ⊚ | ⊚ | ⊚ | ⊚ |
| After Endurance Test at High Humidity | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ∘ | ⊚ | ⊚ | ⊚ | ⊚ | ∘ | Δ |
| | Residual Potential | ⊚ | ⊚ | ⊚ | ⊚ | ⊚ | ⊚ | ⊚ |
| | Ghost | ∘ | ∘ | ⊚ | ⊚ | ⊚ | ∘ | ⊚ |
| | Image Defect | ∘ | ∘ | ∘ | ∘ | ∘ | ∘ | ∘ |
| | Toner Filming | x | Δ | ⊚ | ⊚ | ⊚ | Δ | x |

Evaluation: ⊚ ... Very good, ∘ ... Good, Δ ... No practical difficulty, x ... Not practical.

TABLE 22

| Element | Component Ratio (atomic %) | | | | | | |
|---|---|---|---|---|---|---|---|
| | G | H | I | B | J | K | L |
| Si (Total) | 12.4 | 12.3 | 12.0 | 12.5 | 11.9 | 11.7 | 11.3 |
| Si (Si—C) | 9.1 | 8.9 | 9.2 | 9.0 | 8.7 | 9.1 | 8.4 |
| Si (Si—O) | 5.4 | 3.9 | 3.4 | 2.7 | 1.3 | 0.9 | 0.5 |
| C (Total) | 23.0 | 24.1 | 23.9 | 24.0 | 25.0 | 26.9 | 27.1 |
| C (C—O) | 5.1 | 4.9 | 4.7 | 4.2 | 5.2 | 4.8 | 5.1 |
| O (Total) | 6.3 | 5.9 | 5.5 | 5.3 | 5.1 | 4.9 | 5.0 |
| H | 56.3 | 55.8 | 56.5 | 56.3 | 56.2 | 54.3 | 54.5 |
| F | 2.0 | 1.9 | 2.1 | 1.9 | 1.8 | 2.2 | 2.1 |

Si (Si—C): Component ratio of Si atoms having Si—C bonding.
Si (Si—O): Component ratio of Si atoms having Si—O bonding.
C (C—O): Component ratio of C atoms having C—O bonding.

EXAMPLE 11

An electrophotographic light-receiving member was formed by using the production apparatus shown in FIGS. 6 and 7 in accordance with the same procedure as that in Example 9. The conditions for the formation of a photoconductive layer and a surface layer were as shown in Table 23. In regard to the surface layer, the flow rates of methane gas, oxygen gas, nitrogen monoxide gas and methyl ether gas were changed for changing the ratio of carbon atoms bonded to oxygen atoms to produce drums under the six different conditions M to R, as shown in Table 24. In addition, separate surface layers only (referred to as "samples" hereinafter) were formed on the same cylinder by using the same apparatus as that shown in FIGS. 6 and 7.

The drums and samples were evaluated and analyzed in the same manner as that in Example 9.

Tables 25 and 26 show the results of the evaluation and the initial values obtained by quantitative analysis. It was found from the results that there is a proper ratio of carbon atoms bonded to oxygen atoms. The remarkable superiority of the drums was confirmed in the properties after the endurance test in a high-humidity environment.

TABLE 23

| Film-Forming Conditions | Layer Structure | |
|---|---|---|
| | Photoconductive Layer | Surface Layer |
| Raw Gas Flow Rate | | |
| $SiH_4$ | 350 sccm | 25 sccm |
| $Si(CH_3)_4$ | 0 sccm | 70 sccm |
| $CH_4$ | 0 sccm | * |
| $(CH_3)_2O$ | 0 sccm | * |
| $O_2$ | 0 sccm | * |
| NO | 3 sccm | * |
| $B_2H_6$ | 50 ppm | 0 ppm |
| $H_2$ | 100 sccm | 400 sccm |
| $SiF_4$ | 0 sccm | 15 sccm |
| Pressure | 8 mTorr | 9 mTorr |
| Microwave Power | 1000 W | 900 W |
| Bias Voltage | 100 V | 120 V |
| Layer Thickness | 25 μm | 0.03 μm |

*Shown in Table 24

TABLE 24

| Raw Gas | Sample Name | | | | | |
|---|---|---|---|---|---|---|
| | M | N | O | P | Q | R |
| $CH_4$ (sccm) | 0 | 10 | 20 | 40 | 50 | 60 |
| $(CH_3)_2O$ (sccm) | 40 | 33 | 26 | 14 | 7 | 0 |
| $O_2$ (sccm) | 0 | 3 | 5 | 9 | 11 | 14 |
| NO (sccm) | 0 | 2 | 4 | 8 | 10 | 12 |

TABLE 25

| Evaluation Item | | Sample Name | | | | | | |
|---|---|---|---|---|---|---|---|---|
| | | M | N | O | B | P | Q | R |
| Initial Properties | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ⊚ | ⊚ | ⊚ | ⊚ | ⊚ | ⊚ | ⊚ |
| | Residual Potential | ⊚ | ⊚ | ⊚ | ⊚ | ⊚ | ⊚ | ⊚ |
| | Ghost | ○ | ○ | ⊚ | ⊚ | ⊚ | ○ | ○ |
| | Image Defect | ⊚ | ⊚ | ⊚ | ⊚ | ⊚ | ⊚ | ⊚ |
| After Endurance Test at High Humidity | Chargeability | ⊚ | ⊚ | ⊚ | ⊚ | ⊚ | ⊚ | ⊚ |
| | Sensitivity | ⊚ | ⊚ | ⊚ | ⊚ | ⊚ | ⊚ | ⊚ |
| | Image Flowing | ○ | ⊚ | ⊚ | ⊚ | ⊚ | ○ | Δ |
| | Residual Potential | ⊚ | ⊚ | ⊚ | ⊚ | ⊚ | ⊚ | ⊚ |
| | Ghost | ○ | ○ | ⊚ | ⊚ | ⊚ | ○ | ⊚ |
| | Image Defect | ○ | ○ | ○ | ○ | ○ | ○ | ○ |
| | Toner Filming | x | Δ | ⊚ | ⊚ | ⊚ | Δ | x |

Evaluation: ⊚ ... Very good, ○ ... Good, Δ ... No practical difficulty, x ... Not practical.

TABLE 26

| Element | Component Ratio (atomic %) | | | | | | |
|---|---|---|---|---|---|---|---|
| | M | N | O | B | P | Q | R |
| Si (Total) | 12.3 | 11.8 | 12.1 | 12.5 | 11.5 | 12.1 | 12.3 |
| Si (Si—C) | 8.8 | 9.1 | 9.0 | 9.0 | 8.5 | 8.7 | 8.8 |
| Si (Si—O) | 2.7 | 2.5 | 2.7 | 2.7 | 2.8 | 3.1 | 2.5 |
| C (Total) | 24.1 | 25.1 | 24.8 | 24.0 | 25.1 | 24.7 | 24.5 |
| C (C—O) | 10.8 | 8.5 | 6.9 | 4.2 | 2.9 | 1.6 | 1.3 |
| O (Total) | 7.2 | 6.2 | 5.8 | 5.3 | 5.4 | 5.1 | 4.8 |
| H | 54.4 | 54.8 | 55.1 | 56.3 | 56.2 | 56.0 | 56.7 |
| F | 2.0 | 2.1 | 2.2 | 1.9 | 1.8 | 2.1 | 1.7 |

Si (Si—C): Component ratio of Si atoms having Si—C bonding.
Si (Si—O): Component ratio of Si atoms having Si—O bonding.
C (C—O): Component ratio of C atoms having C—O bonding.

EXAMPLE 12

The content of fluorine atoms in the surface layer was changed within the range of the invention to prepare a plurality of analytical samples under the conditions of film formation shown in Table 27. Each of the samples was set in an electrophotographic apparatus (produced by converting NP7750 manufactured by Canon Inc. for tests in the invention) and then subjected to corona discharge corresponding to copying of 1,000,000 sheets under the condition that a voltage of 6 kV was applied to a charger. The number of silicon atoms bonded to carbon atoms after the corona discharge was compared with that before the corona discharge.

TABLE 27

| Film-Forming Conditions | Sample Name | | | | | |
|---|---|---|---|---|---|---|
| | S | T | U | V | W | X |
| Raw Gas Flow Rate (sccm) | | | | | | |
| $SiH_4$ | 34 | 33 | 30 | 11 | 0 | 0 |
| $Si(CH_3)_4$ | 70 | 70 | 70 | 70 | 70 | 70 |
| $CH_4$ | 30 | 30 | 30 | 30 | 25 | 5 |
| $(CH_3)_2O$ | 20 | 20 | 20 | 20 | 20 | 20 |
| $O_2$ | 7 | 7 | 7 | 7 | 7 | 7 |
| NO | 6 | 6 | 6 | 6 | 6 | 6 |
| $SiF_4$ | 1.2 | 3 | 7.5 | 36 | 52.5 | 52.5 |
| $CF_4$ | 0 | 0 | 0 | 0 | 7.5 | 37.5 |
| $H_2$ | 400 | 400 | 400 | 400 | 400 | 400 |
| Pressure (mTorr) | 9 | 9 | 9 | 9 | 9 | 9 |
| Microwave Power (W) | 900 | 900 | 900 | 900 | 900 | 900 |
| Bias Voltage (V) | 120 | 120 | 120 | 120 | 120 | 120 |
| Layer Thickness (μm) | 0.03 | 0.03 | 0.03 | 0.03 | 0.03 | 0.03 |

COMPARATIVE EXAMPLES 3 AND 4

For comparison with the sample prepared in Example 12, analytical samples were prepared under the production conditions shown in Table 28 and evaluated by the same method as that employed in Example 12.

TABLE 28

| Film-Forming Conditions | Comparative Example 3 | Comparative Example 4 |
|---|---|---|
| Raw Gas Flow Rate (sccm) | | |
| $SiH_4$ | 34 | 0 |
| $Si(CH_3)_4$ | 70 | 70 |
| $CH_4$ | 30 | 0 |
| $(CH_3)_2O$ | 20 | 20 |
| $O_2$ | 7 | 7 |
| NO | 6 | 6 |
| $SiF_4$ | 0.7 | 52.5 |
| $CF_4$ | 0 | 52.5 |
| $H_2$ | 400 | 400 |
| Pressure (mTorr) | 9 | 9 |
| Microwave Power (W) | 900 | 900 |
| Bias Voltage (V) | 120 | 120 |

TABLE 28-continued

| Film-Forming Conditions | Comparative Example 3 | Comparative Example 4 |
|---|---|---|
| Layer Thickness (μm) | 0.03 | 0.03 |

The results obtained from Example 12 and Comparative Examples 3 and 4 are shown in Table 29.

TABLE 29

| Sample Name | F Content (atomic %) | Evaluation |
|---|---|---|
| Comparative Example 3 | 0.08 | Δ |
| S | 0.11 | ○-Δ |
| T | 0.31 | ○ |
| U | 0.68 | ⊙ |
| V | 3.7 | ⊙ |
| W | 6.5 | ○ |
| X | 9.5 | ○-Δ |
| Comparative Example 4 | 10.8 | x |

The results of evaluation shown in Table 29 show comparison of the number of silicon atoms bonded to carbon atoms after the corona discharge with that before the corona discharge on the basis of the following criteria:
⊙ ... Substantially no change.
○ ... Slight decrease was confirmed.
Δ ... Significant decrease was confirmed, without any trouble in a conventional method.
x ... Significant decrease was confirmed, without practicability.

In the table, ○-Δ shows that when the same experiment was repeated several times, both the marks ○ and Δ were obtained as results of evaluation.

EXAMPLE 13

A charge injection inhibition layer, a photoconductive layer and a lower surface layer were formed on a substrate by using the production apparatus shown in FIGS. 6 and 7 under the conditions shown in Table 30, and a surface layer was then formed under the same conditions as those for Sample A of Example 9.

TABLE 30

| Film-Forming Conditions | Layer Structure | | |
|---|---|---|---|
| | Charge Injection Inhibition Layer | Photo-conductive Layer | Lower Surface Layer |
| Raw Gas Flow Rate | | | |
| SiH₄ | 350 sccm | 350 sccm | 70 sccm |
| Ne | 100 sccm | 100 sccm | 100 sccm |
| CH₄ | 35 sccm | 0 sccm | 350 sccm |
| B₂H₆ | 1000 ppm | 0 ppm | 0 ppm |
| Pressure | 10 mTorr | 9 mTorr | 11 mTorr |
| Microwave Power | 1000 W | 1000 W | 1000 W |
| Bias Voltage | 100 V | 100 V | 100 V |
| Layer Thickness | 3 μm | 20 μm | 0.5 μm |

As a result of evaluation of the drum in the same manner as in Example 9, good results were obtained, in accordance with the drum formed under the conditions for Sample A of Example 9.

EXAMPLE 14

A photoconductive layer was formed under the conditions shown in Table 31, and a surface layer was then formed under the same conditions as those in Sample B of Example 9.

TABLE 31

| Film-Forming Conditions | Layer Structure | | |
|---|---|---|---|
| | Charge Injection Inhibition Layer | Charge Transport Layer | Charge Generating Layer |
| Raw Gas Flow Rate | | | |
| SiH₄ | 350 sccm | 350 sccm | 350 sccm |
| Ne | 100 sccm | 100 sccm | 100 sccm |
| CH₄ | 35 sccm | 35 sccm | 0 sccm |
| B₂H₆ | 1000 ppm | 0 ppm | 0 ppm |
| Pressure | 10 Torr | 10 mTorr | 9 mTorr |
| Microwave Power | 1000 W | 1000 W | 1000 W |
| Bias Voltage | 100 V | 100 V | 100 V |
| Layer Thickness | 3 μm | 20 μm | 0.5 μm |

As a result of evaluation of the drum in the same manner as in Example 9 good results were obtained, in accordance with the drum formed under the conditions for Sample B of Example 9.

EXAMPLE 15

A photoconductive layer was formed by the RF discharge process under the conditions shown in Table 32 and a surface layer was then formed by using the production apparatus shown in FIGS. 6 and 7 under the same conditions as those for Sample B of Example 9.

TABLE 32

| Film-Forming Conditions | Layer Structure | |
|---|---|---|
| | Charge Injection Inhibition Layer | Photo-conductive Layer |
| Raw Gas Flow Rate | | |
| SiH₄ | 250 sccm | 350 sccm |
| Ne | 250 sccm | 350 sccm |
| CH₄ | 0 sccm | 0 sccm |
| B₂H₆ | 1000 ppm | 0 ppm |
| Pressure | 0.3 mTorr | 0.5 mTorr |
| RF Power | 300 W | 400 W |
| Layer Thickness | 3 μm | 25 μm |

As a result of evaluation of the thus-formed drum in the same manner as in Example 9, good results were obtained, in accordance with the drum formed under the conditions for Sample B of Example 9.

EXAMPLE 16

The same photoconductive layer as that formed in Example 9 was formed, and a surface layer was then formed under the same conditions as those for Sample B of Example 9, while the thickness was changed to 5 Å to 1 μm.

As a result of evaluation of the thus-formed drum in the same manner as in Example 9, good results were obtained from samples comprising the surface layers having thicknesses from 10 Å to 500 Å, like the drum formed under the conditions for Sample B of Example 9. The advantages of the present invention were thus confirmed.

EXAMPLE 17

The same evaluations as those performed in Examples 9 to 15 were performed, while the contents of silicon, carbon, oxygen, hydrogen and fluorine atoms in the surface layer were changed. As a result, it was confirmed that assuming that the composition of a surface layer is $(Si_xC_yO_z)_tH_uF_v$ (wherein $x+y+z=1$, $t+u+v=1$), when $0.1 \leq x \leq 0.4$, $0.4 \leq y \leq 0.7$, $0.05 \leq z \leq 0.2$, $0.299 \leq t \leq 0.589$, $0.41 \leq u \leq 0.7$, and $0.001 \leq v \leq 0.1$, the drum of the present invention shows good electrophotographic properties. The advantages of the present invention were thus confirmed.

The electrophotographic light-receiving member of the present invention which is designed so as to have the above-described layer structure is capable of solving all the problems and exhibits excellent electrical, optical and photoconductive properties and excellent durability and working environmental properties.

The present invention can also provide an electrophotographic light-receiving member excellent in preventing filming.

Particularly, the present invention enables the attainment of a great effect of preventing filming of a toner for pressure fixing.

While the present invention has been described with respect to what is presently considered to be the preferred embodiments, it is to be understood that the invention is not limited to the disclosed embodiments. To the contrary, the invention is intended to cover various modifications and equivalent formulations included within the spirit and scope of the appended claims. The scope of the following claims is to be accorded the broadest interpretation so as to encompass all such modifications and equivalent formulations and functions.

What is claimed is:

1. An electrophotgraphic light-receiving member comprising a non single crystal layer comprising at least silicon, carbon, oxygen, hydrogen and fluorine atoms as an outermost surface layer, wherein the ratio of silicon atoms bonded to carbon atoms in said non-single crystal layer is 50 to 100 atomic % of the total number of silicon atoms therein, the ratio of silicon atoms bonded to oxygen atoms in said non-single crystal layer is 10 to 30 atomic % of the total number of silicon atoms therein, and said non-single crystal layer is substantially composed of a non-single crystal $(Si_xC_yO_z)_tH_uF_v$ wherein $0.1 \leq x \leq 0.4$, $0.4 \leq y \leq 0.7$, $0.05 \leq z \leq 0.2$, $x+y+z=1$, $0.299 \leq t \leq 0.589$, $0.41 \leq u \leq 0.7$, $0.001 \leq v \leq 0.1$ and $t+u+v=1$.

2. An electrophotographic light-receiving member according to claim 1, wherein the thickness of said non-single crystal layer is 10 to 500 Å.

3. An electrophotographic light-receiving member, comprising a non-single crystal layer comprising at least silicon, carbon, oxygen, hydrogen and fluorine atoms as an outermost surface, wherein the ratio of silicon atoms bonded to carbon atoms in said non single crystal layer is 50 to 100 atomic % of the total number of silicon atoms therein, the ratio of silicon atoms bonded to oxygen atoms is 10 to 30 atomic % of the total number of silicon atoms therein, the ratio of carbon atoms bonded to oxygen atoms is 10 to 30 atomic % of the total number of carbon atoms therein and said non-single crystal layer is substantially composed of non-single crystal silicon having the formula $(Si_xC_yO_z)_tH_uF_v$ wherein $0.1 \leq x \leq 0.4$, $0.4 \leq y \leq 0.7$, $0.05 \leq z \leq 0.2$, $0.299 \leq t \leq 0.589$, $041 \leq u \leq 0.7$, $0.001 \leq v \leq 0.1$, $x+y+z=1$ and $t+u+v=1$.

4. An electrophotographic light-receiving member according to claim 3, wherein the thickness of said non-single crystal layer is 10 to 500 Å.

5. An electrophotographic light-receiving member according to any one of claims 1 or 3, wherein the ratio of silicon atoms bonded to carbon atoms in said outermost surface layer is at least 60% of the total number of silicon atoms in said outermost surface layer.

6. An electrophotographic light-receiving member according to claim 5, wherein said ratio is at least 70%.

7. An electrophotographic light-receiving member according to any one of claims 1 or 3, wherein the content of carbon atoms in said surface layer is 40 to 90 atomic % of the total number of silicon and carbon atoms in said outermost surface layer.

* * * * *

UNITED STATES PATENT AND TRADEMARK OFFICE
CERTIFICATE OF CORRECTION

PATENT NO. : 5,284,730

DATED : February 8, 1994

INVENTOR(S) : TETSUYA TAKEI, ET AL.

It is certified that error appears in the above-identified patent and that said Letters Patent is hereby corrected as shown below:

ON TITLE PAGE

In [56] References Cited, under FOREIGN PATENT DOCUMENTS:
"60-67951  4/1984  Japan" should read
--60-67951  4/1985  Japan--.

COLUMN 3

Line 6, "$03 \leq t \leq 0.59$," should read --$0.3 \leq t \leq 0.59$,--.

COLUMN 5

Line 39, "cased" should read --caused--.
Line 43, "surface" should read --surface of--.

COLUMN 6

Line 16, "portion" should read --portions--.
Line 34, "$SiO_2$," should read --$SiO_x$,--.

COLUMN 10

Line 25, "radius R," should read --radius R',--.

COLUMN 11

Line 9, "(3) n$^-$-containing" should read --(3) n$^-$-type A-Si(H,X)-containing--.
Line 43, "$Si_3H_8$," should read --$Si_3H_8$, $Si_4H_{10}$--.

UNITED STATES PATENT AND TRADEMARK OFFICE
CERTIFICATE OF CORRECTION

PATENT NO. : 5,284,730
DATED : February 8, 1994
INVENTOR(S) : TETSUYA TAKEI, ET AL.

It is certified that error appears in the above-identified patent and that said Letters Patent is hereby corrected as shown below:

COLUMN 12

Line 43, "SiHRr$_3$" should read --SiHBr$_3$--.

COLUMN 13

Line 24, "a" should read --as--.

COLUMN 16

Line 26, "Its" should read --It--.

COLUMN 18

Line 42, "know" should read --known--.

COLUMN 19

Line 34, "It" should read --If--.
Line 47, "are" should read --is--.

COLUMN 20

Line 52, "hodl" should read --hold--.

COLUMN 35

Line 26, "electrophotgraphic" should read --electrophotographic--.
Line 27, "non single" should read --non-single--.

UNITED STATES PATENT AND TRADEMARK OFFICE
CERTIFICATE OF CORRECTION

PATENT NO. : 5,284,730
DATED : February 8, 1994
INVENTOR(S) : TETSUYA TAKEI, ET AL.

It is certified that error appears in the above-identified patent and that said Letters Patent is hereby corrected as shown below:

COLUMN 36

Line 10, "non single" should read --non-single--.
Line 20, "041$\leq$u$\leq$0.7," should read --0.41$\leq$u$\leq$0.7,--.

Signed and Sealed this

First Day of November, 1994

Attest:

Attesting Officer

BRUCE LEHMAN

Commissioner of Patents and Trademarks